(12) United States Patent
Sukegawa et al.

(10) Patent No.: US 9,954,024 B2
(45) Date of Patent: *Apr. 24, 2018

(54) SEMICONDUCTOR DEVICE, SOLID-STATE IMAGE SENSOR AND CAMERA SYSTEM

(71) Applicant: Sony Corporation, Tokyo (JP)

(72) Inventors: Shunichi Sukegawa, Ibaraki (JP); Noriyuki Fukushima, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/668,265

(22) Filed: Aug. 3, 2017

(65) Prior Publication Data
US 2017/0330912 A1 Nov. 16, 2017

Related U.S. Application Data

(63) Continuation of application No. 15/448,869, filed on Mar. 3, 2017, now Pat. No. 9,762,835, which is a (Continued)

(30) Foreign Application Priority Data

Jan. 8, 2010 (JP) .................................. 2010-002979
Nov. 16, 2010 (JP) .................................. 2010-255934

(51) Int. Cl.
*H01L 27/146* (2006.01)
*H01L 25/16* (2006.01)
(Continued)

(52) U.S. Cl.
CPC ...... *H01L 27/14634* (2013.01); *H01L 25/167* (2013.01); *H01L 27/14636* (2013.01);
(Continued)

(58) Field of Classification Search
CPC . H01L 25/16; H01L 25/162167; H01L 21/18; H01L 27/14621; H01L 27/14618;
(Continued)

(56) References Cited

U.S. PATENT DOCUMENTS 6,362,626 B2 * 3/2002 Furukawa .......... G01R 31/3658
320/120
7,009,287 B2 * 3/2006 Sun .................... H01L 27/14618
257/686

(Continued)

FOREIGN PATENT DOCUMENTS

WO WO 2006/129762 12/2006

OTHER PUBLICATIONS

Official Action for European Patent Application No. 10842233.8 dated Nov. 3, 2017, 8 pages.
(Continued)

*Primary Examiner* — Pritham Prabhakher
(74) *Attorney, Agent, or Firm* — Sheridan Ross P.C.

(57) ABSTRACT

The present invention relates to a semiconductor device, a solid-state image sensor and a camera system capable of reducing the influence of noise at a connection between chips without a special circuit for communication and reducing the cost as a result. The semiconductor device includes: a first chip; and a second chip, wherein the first chip and the second chip are bonded to have a stacked structure, the first chip has a high-voltage transistor circuit mounted thereon, the second chip has mounted thereon a low-voltage transistor circuit having lower breakdown voltage than the high-voltage transistor circuit, and wiring between the first chip and the second chip is connected through a via formed in the first chip.

10 Claims, 22 Drawing Sheets

Related U.S. Application Data continuation of application No. 15/273,565, filed on Sep. 22, 2016, now Pat. No. 9,634,052, which is a continuation of application No. 15/176,602, filed on Jun. 8, 2016, now Pat. No. 9,565,383, which is a continuation of application No. 14/742,178, filed on Jun. 17, 2015, now Pat. No. 9,641,777, which is a continuation of application No. 13/519,450, filed as application No. PCT/JP2010/073671 on Dec. 28, 2010, now Pat. No. 9,093,363.

(51) Int. Cl.
*H04N 5/232* (2006.01)
*H04N 5/369* (2011.01)

(52) U.S. Cl.
CPC ... *H01L 27/14643* (2013.01); *H04N 5/23241* (2013.01); *H04N 5/369* (2013.01)

(58) Field of Classification Search
CPC ......... H01L 27/14627; H01L 27/14634; H01L 27/3297; H01L 2924/0002; H01L 2924/00; H01L 23/498; H01L 23/49838; H01L 23/50; H01L 23/528; H01L 23/5286; H01L 24/49; H01L 24/45; H01L 24/48; H01L 2224/45144; H01L 2224/48091; H01L 2224/48227; H01L 2224/48465; H01L 2224/49171; H01L 2224/49433; H01L 2224/85444; H01L 2225/0651; H01L 2225/06527; H01L 2225/06575; H01L 2225/06586; H01L 2924/1306; H01L 2924/13091; H01L 2924/01004; H01L 2924/01005; H01L 2924/01014; H01L 2924/01015; H01L 2924/01028; H01L 2924/01029; H01L 2924/01038; H01L 2924/01079; H01L 2924/14; H01L 2924/15311; H01L 2924/19041; H01L 2924/19042; H01L 2924/19043; H01L 2924/30105; H01L 2924/3025; H01L 2924/01006; H01L 2924/01023; H01L 2027/11881
USPC ........................................................ 348/294
See application file for complete search history.

(56) References Cited

U.S. PATENT DOCUMENTS

| | | | | |
|---|---|---|---|---|
| 7,129,985 | B1* | 10/2006 | Koizumi | H04N 5/335 348/207.99 |
| 7,164,113 | B2* | 1/2007 | Inokuma | H04N 5/2253 250/208.1 |
| 7,271,834 | B2* | 9/2007 | Kasuga | H04N 5/335 257/E27.132 |
| 7,795,650 | B2* | 9/2010 | Eminoglu | H01L 27/14634 257/228 |
| 8,362,617 | B2* | 1/2013 | Nikitin | H01L 23/49517 257/700 |
| 8,890,989 | B2* | 11/2014 | Yamashita | H01L 23/481 348/308 |
| 2004/0095495 | A1* | 5/2004 | Inokuma | H04N 5/2253 348/308 |
| 2004/0263668 | A1* | 12/2004 | Kim | H01L 27/14618 348/340 |
| 2005/0024524 | A1* | 2/2005 | Yourlo | H04N 5/3559 348/372 |
| 2005/0035381 | A1 | 2/2005 | Holm et al. | |
| 2005/0189624 | A1* | 9/2005 | Sun | H01L 27/14618 257/666 |
| 2006/0186315 | A1 | 8/2006 | Lee et al. | |
| 2006/0220673 | A1 | 10/2006 | Hiranuma et al. | |
| 2008/0042046 | A1* | 2/2008 | Mabuchi | H01L 27/14634 250/208.1 |
| 2008/0042227 | A1* | 2/2008 | Asano | H01L 27/14618 257/432 |
| 2008/0083939 | A1 | 4/2008 | Guidash | |
| 2009/0057915 | A1* | 3/2009 | Koike | H01L 23/4334 257/777 |
| 2010/0038523 | A1* | 2/2010 | Venezia | H01L 27/14627 250/216 |
| 2010/0045835 | A1* | 2/2010 | Matsunaga | H01L 27/14627 348/308 |
| 2010/0140732 | A1* | 6/2010 | Eminoglu | H01L 27/14634 257/447 |
| 2010/0276572 | A1* | 11/2010 | Iwabuchi | H01L 27/14625 250/208.1 |
| 2011/0063483 | A1* | 3/2011 | Rossi | H04N 5/3454 348/294 |

OTHER PUBLICATIONS

Extended European Search Report for European Patent Application No. 1718 032.6 dated Nov. 7, 2017, 11 pages.

* cited by examiner

SEMICONDUCTOR DEVICE, SOLID-STATE IMAGE SENSOR AND CAMERA SYSTEM

CROSS-REFERENCE TO RELATED APPLICATIONS

This application is a continuation of U.S. patent application Ser. No. 15/448,869, filed Mar. 3, 2017, which is a continuation of U.S. patent application Ser. No. 15/273,565, filed Sep. 22, 2016, now U.S. Pat. No. 9,634,052, which is a continuation of U.S. patent application Ser. No. 15/176,602, filed Jun. 8, 2016, now U.S. Pat. No. 9,565,383, which is a continuation of U.S. patent application Ser. No. 14/742,178, filed Jun. 17, 2015, now U.S. Pat. No. 9,641,777, which is a continuation of U.S. patent application Ser. No. 13/519,450, filed Jun. 27, 2012, now U.S. Pat. No. 9,093,363, which a national stage application under 35 U.S.C. 371 and claims the benefit of PCT Application No. PCT/JP2010/073671, having an international filing date of Dec. 28, 2010, which designated the United States, which claims priority to Japanese Patent Application Nos. JP 2010-002979 and JP 2010-255934, filed Jan. 8, 2010 and Nov. 16, 2010, respectively, the entire disclosures of which are hereby incorporated herein by reference.

TECHNICAL FIELD

The present invention relates to a semiconductor device having a stacked structure of two chips, a solid-state image sensor and a camera system.

BACKGROUND ART

In related art, an imaging device is assembled as a module in which two chips, which are a CMOS image sensor (CIS) chip and an image processor chip, are respectively mounted on packages.

Alternatively, the chips may be mounted chip-on-board (COB).

Recently, there has been a need for reduction in mounting areas and in size for mounting an imaging device on a cellular phone or the like, and a System on Chip (SOC) that integrates the two chips on one chip has been developed (see FIG. 2(A)).

A process combining a CIS process and a high-speed logic process for integration on one chip, however, results in an increase in the number of processes and high cost, and moreover, it is difficult for such process to produce both analog characteristics and logic characteristics, which may cause degradation in the characteristics of the imaging device.

In this regard, methods for assembling the two chips at the chip level while both reducing the size and improving the characteristics are proposed (see Patent Literatures 1 and 2).

CITATION LIST

Patent Literatures

Patent Literature 1: Japanese Patent Application Laid-Open No. 2004-146816

Patent Literature 2: Japanese Patent Application Laid-Open No. 2008-85755

SUMMARY OF INVENTION

Problems to be Solved by the Invention

For connecting two chips, however, the arrangement pitch is small owing to the chip structures and the yield may be lowered.

Moreover, supply of DC components of power supply and reference signals from the lower chip to the upper chip is susceptible to 1/f noise or the like. There is thus a disadvantage that a special circuit is needed for communication between the upper and lower chips, which results in an increase in cost.

It is thus desirable to provide a semiconductor device, a solid-state image sensor and a camera system capable of reducing the influence of noise at the connection between chips without a special circuit for communication and reducing the cost as a result.

Solution to Problems

According to a first aspect of the present invention, there is provided a semiconductor device including: a first chip; and a second chip, wherein the first chip and the second chip are bonded to have a stacked structure, the first chip has a high-voltage transistor circuit mounted thereon, the second chip has mounted thereon a low-voltage transistor circuit having lower breakdown voltage than the high-voltage transistor circuit, and wiring between the first chip and the second chip is connected through a via formed in the first chip.

According to a second aspect of the present invention, there is provided a solid-state image sensor including: a pixel unit in which a plurality of pixels that performs photoelectric conversion is arranged in a matrix; and a pixel signal readout circuit that reads out pixel signals in units of a plurality of pixels from the pixel unit, wherein the pixel signal readout circuit includes: a plurality of comparators that is arranged in association with a column arrangement of the pixels, compares a readout signal potential and a reference voltage, makes determination on the comparison and outputs a determination signal; a plurality of counters whose operation is controlled by outputs from the comparators and which counts a comparison time of each associated comparators; a first chip; and a second chip, wherein the first chip and the second chip are bonded to have a stacked structure, the first chip has mounted thereon at least the pixel unit and the comparators of the pixel signal readout circuit, the second chip has mounted thereon at least the counters of the pixel signal readout circuit, and wiring between the first chip and the second chip is connected through a via formed in the first chip.

According to a third aspect of the present invention, there is provided a camera system including: a solid-state image sensor; and an optical system that forms a subject image on image sensor, wherein the solid-state image sensor includes: a pixel unit in which a plurality of pixels that performs photoelectric conversion is arranged in a matrix; and a pixel signal readout circuit that reads out pixel signals in units of a plurality of pixels from the pixel unit, wherein the pixel signal readout circuit includes: a plurality of comparators that is arranged in association with a column arrangement of the pixels, compares a readout signal potential and a reference voltage, makes determination on the comparison and outputs a determination signal; a plurality of counters whose operation is controlled by outputs from the comparators and which counts a comparison time of each associated comparators; a first chip; and a second chip, wherein the first chip and the second chip are bonded to have a stacked structure, the first chip has mounted thereon at least the pixel unit and the comparators of the pixel signal readout circuit, the second chip has mounted thereon at least the counters of the pixel signal readout circuit, and wiring between the first chip and the second chip is connected through a via formed in the first chip.

Effects of the Invention

According to the present invention, the influence of noise at the connection between chips can be reduced, a special circuit for communication is not needed and the cost can be reduced as a result.

MODE FOR CARRYING OUT THE INVENTION

An embodiment of the present invention will be described below with reference to the drawings.

The description will be made in the following order:
1. Outline of solid-state image sensor;
2. Process flow;
3. Circuit layout; and
4. TCV (through contact via) layout.
<1. Outline of Solid-State Image Sensor>

Figure 1:
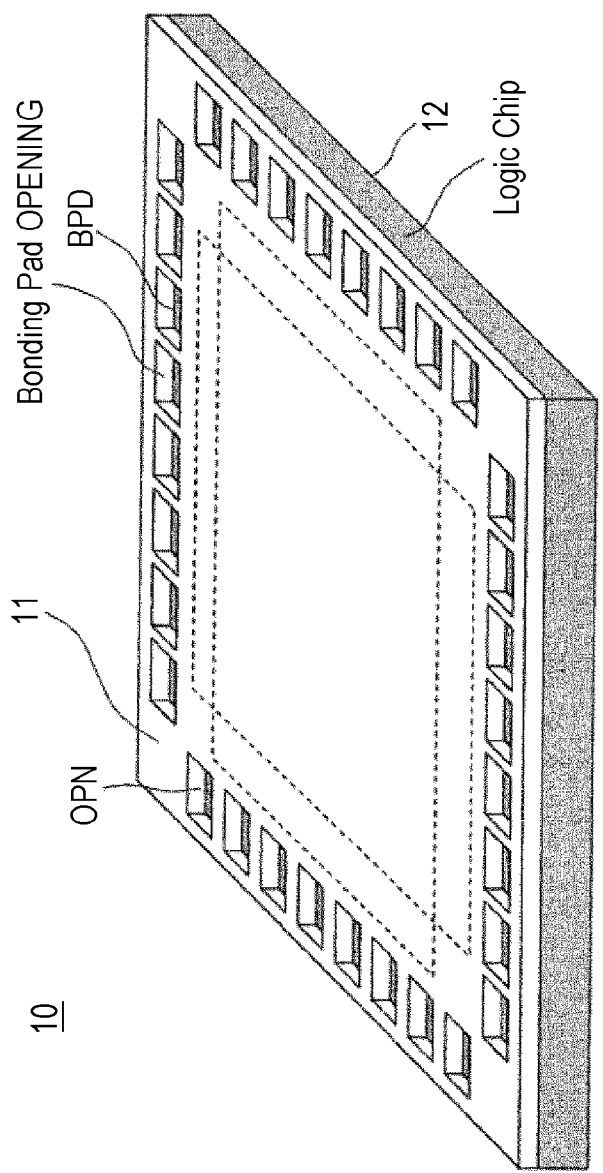
FIG. 1 is a diagram illustrating an exemplary configuration of a solid-state image sensor that is a semiconductor device according to an embodiment of the present invention.

FIG. 1 is a diagram illustrating an exemplary configuration of a solid-state image sensor that is a semiconductor device according to the embodiment of the present invention.

In the embodiment, a configuration of a CMOS image sensor will be described as an example of the semiconductor device.

As illustrated in FIG. 1, a solid-state image sensor 10 has a stacked structure including a first chip (upper chip) 11 and a second chip (lower chip) 12.

The solid-state image sensor 10 is formed as an imaging device having a stacked structure through bonding at the wafer level and then cutting by dicing as will be described later.

In the stacked structure including the two upper and lower chips, the first chip 11 is a CMOS image sensor (CIS) chip and the second chip 12 is a logic chip including a control circuit for the first chip and an image processing circuit.

The second chip (lower chip) 12 has formed thereon a bonding pad BPD and an input/output circuit, and openings OPN for wire bonding on the second chip 12 are formed in the first chip (upper chip).

The solid-state image sensor 10 having the stacked structure including two chips according to the embodiment has the following features.

Edge parts where video data signals are communicated between the upper and lower chips 11 and 12 are output parts of a comparator and a $\Sigma\Delta$ modulator that are boundary circuits among analog circuits with digital circuits.

The connection between the upper and lower chips 11 and 12 is made through vias, for example.

The first chip (upper chip) 11 uses a CMOS image sensor (CIS) process. Note that only high-voltage transistors (CMOS) are used for transistors (Tr.) and the minimum necessary number of wiring layers for configurations of a pixel array and peripheral circuits thereof are used to reduce the cost.

Herein, a high-voltage transistor refers to a transistor with a thickness of a gate oxide that is a gate insulator larger than that of a typical MOS transistor and capable of operating without any problem under high voltages.

For a typical CIS process, low-voltage LV, high-speed transistors Tr. are also needed in addition to the high-voltage transistors (HV Tr.) for high-speed logic circuits such as a control circuit and an image processing circuit. Furthermore, more than the minimum necessary number of wiring layers are desirable for the pixel array and the peripheral circuits thereof because of the high-speed logic circuits.

The second chip (lower chip) 12 uses a general logic process to facilitate a change and development in FAB.

Circuits that are necessary for the image sensor 10 and particularly important to characteristics where analog characteristics and noise characteristics (such as 1/f noise) are strictly required are mounted on the first chip (upper chip) 11.

As will be described later, a pixel array, a vertical decoder, a driver, a comparator and a digital-to-analog converter (DAC) are mounted on the first chip 11 in the embodiment.

Circuits that operate at high speeds and at low voltages such as high-speed logic circuits, a memory and an interface (IF) circuit are mounted on the second chip (lower chip) 12. The process technology and the number of wiring layers are determined considering the characteristics and the size required for circuits.

Products are developed by combining a first chip (upper chip) 11 with each of second chips (lower chips) 12 with different functions, characteristics or processes.

As will be described later with reference to FIGS. 5 and 6, the positions where vias are arranged are at chip ends or between the pad (PAD) and a circuit area.

Video signal wires are arranged at an end of a comparator circuit at a wiring pitch of vertical signal lines.

Control signals and power supply TCVs (through contact vias) mainly concentrate on four chip corners to reduce the signal wiring area of the first chip (upper chip) 11.

To deal with the problem of an increase in power line resistance and an increase in IR-Drop resulting from reducing the number of wiring layers on the first chip (upper chip) 11, the TCVs are effectively arranged to enhance the power supply of the first chip (upper chip) 11 by using the wiring of the second chip (lower chip) 12 as measures against noise and for stable supply.

Such features will be described in detail below.

Figure 2:
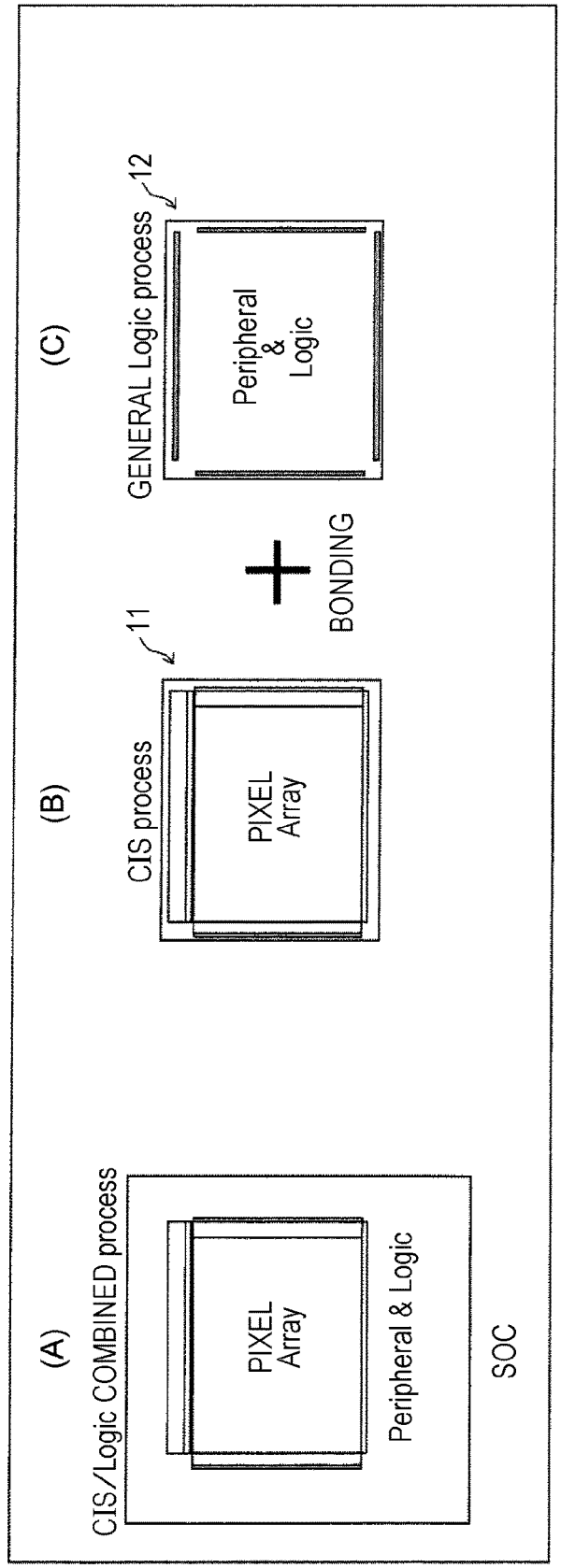
FIG. 2 is a diagram in which the solid-state image sensor according to the embodiment and a typical SOC solid-state image sensor on which an image processor is mounted are compared.

FIGS. 2(A) to 2(C) are diagrams for comparing the solid-state image sensor according to the embodiment and a typical SOC solid-state image sensor on which an image processor is mounted.

FIG. 2(A) illustrates a typical SOC (System on Chip) solid-state image sensor on which an image processor is mounted and which is made of a combined process of a CIS process and a Logic process.

In the embodiment, a pixel array and circuits (such as a comparator and a DAC circuit) with circuit characteristics particularly affected by 1/f noise among analog circuits out of SOC circuits in FIG. 2(A) are mounted on the chip 11 illustrated in FIG. 2(B).

In the embodiment, one chip on which a vertical decoder/driver constituted by high-voltage transistors (HV Tr.), pad openings OPN and the like in addition to the above are integrated is illustrated in FIG. 2(B) and corresponds to the first chip (upper chip) 11 in FIG. 1.

Note that the vertical decoder/driver and pad openings OPN need not necessarily be mounted on the first chip (upper chip) and may be mounted on the second chip (lower chip).

The first chip (upper chip) 11 is constituted by high-voltage transistors (CMOS) and a process in which analog characteristics and noise characteristics including pixel characteristics are sufficiently controlled is used therefor, and the amount of noise thereof is sufficiently small.

The number of wiring layers is the minimum number necessary for circuits constituting the first chip (upper chip) 11 and can be generally made smaller than that for Logic circuits.

The process cost for the first chip (upper chip) 11 can be made lower than that for SOC CIS by using only high-voltage transistors and reducing the number of wiring layers.

Circuits other than those mounted on the first chip (upper chip) 11 are mounted on a Logic chip illustrated in FIG. 2(C).

Circuits that can be made by a low-voltage, high-speed Logic process and IO circuits are those mounted on the Logic chip.

Low-voltage, high-speed transistors Tr. for logic circuits and memory circuits and high-voltage transistors (HV Tr.) for input/output circuits are used for the Logic chip. A low-voltage, high-speed transistor Tr. refers to a transistor with a thickness of a gate insulator equal to or smaller than that of a typical MOS transistor and configured to operate at high speeds even at low voltages.

It is desirable that the circuit configuration be designed by using a common ASIC design flow considering a change and development in FAB, which facilitate product development by combining an upper chip with each of lower chips with different functions, characteristics or processes.

In general, the amount of various noise, RTS and heat such as 1/f noise in a Logic process is larger than that in an analog process where the amount of noise is controlled.

If the problem of noise or the like is attempted to be solved, the cost of the Logic process will rise, and in addition, the Logic circuit characteristics and the reliability thereof may be degraded. Considering a change and development in Logic FAB, analog circuits, in particular circuits with characteristics affected by 1/f noise, are thus mounted on the first chip (upper chip) 11.

If a low cost Logic is used, 1/f noise is not controlled. Conversely, a process where 1/f noise is controlled is high in cost.

<2. Process Flow>

Figure 3:
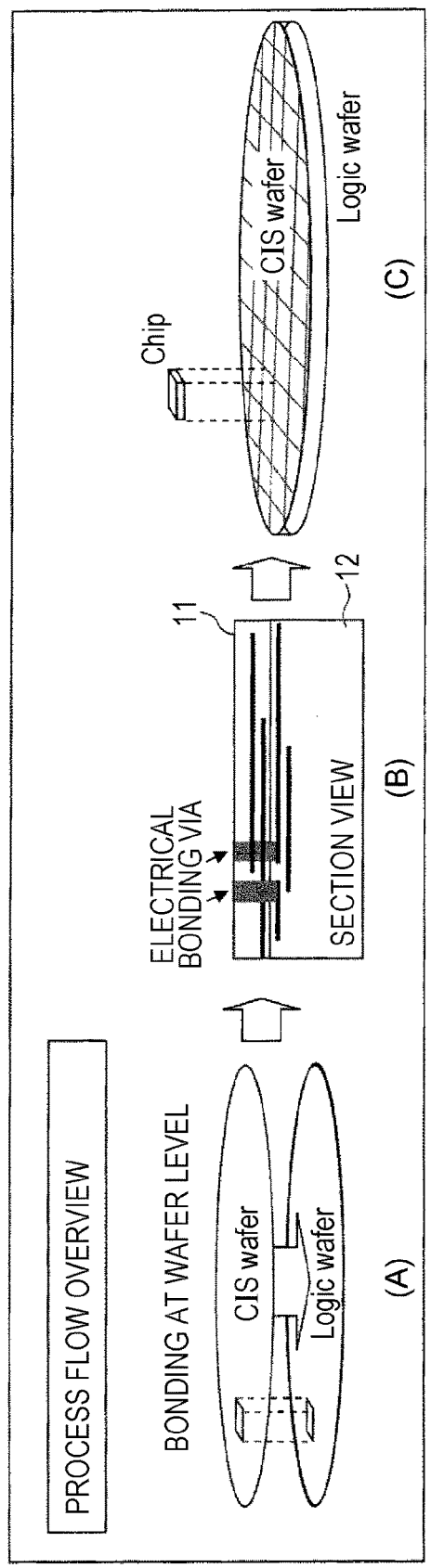
FIG. 3 is a diagram illustrating a process flow for the solid-state image sensor having a stacked structure according to the embodiment.

FIGS. 3(A) to 3(C) are diagrams illustrating a process flow of the solid-state image sensor having the stacked structure according to the embodiment.

As illustrated in FIG. 3(A), after bonding wafers on which upper and lower chips are formed, respectively, by optimum processes, a rear surface of the upper chip is polished to reduce the thickness of the wafer of the upper chip.

The first chip (upper chip 11) is patterned, and then through holes are formed from the first chip 11 to a wiring layer of the second chip (lower chip) 12 and filled with metal to form vias. In the embodiment, the vias are referred to as TCVs.

As illustrated in FIG. 3(B), signals lines and power lines are electrically connected between the upper and lower chips by the TCVs.

Then, as illustrated in FIG. 3(C), after the first chip (upper chip) 11 is processed to produce color filters and micro lenses, chips are cut out by dicing.

<3. Circuit Layout>

Next, a circuit layout, that is, classifications of circuits to be mounted on the first chip (upper chip) 11 and the second chip (lower chip 12), according to the embodiment will be described with reference to FIG. 4.

Figure 4:
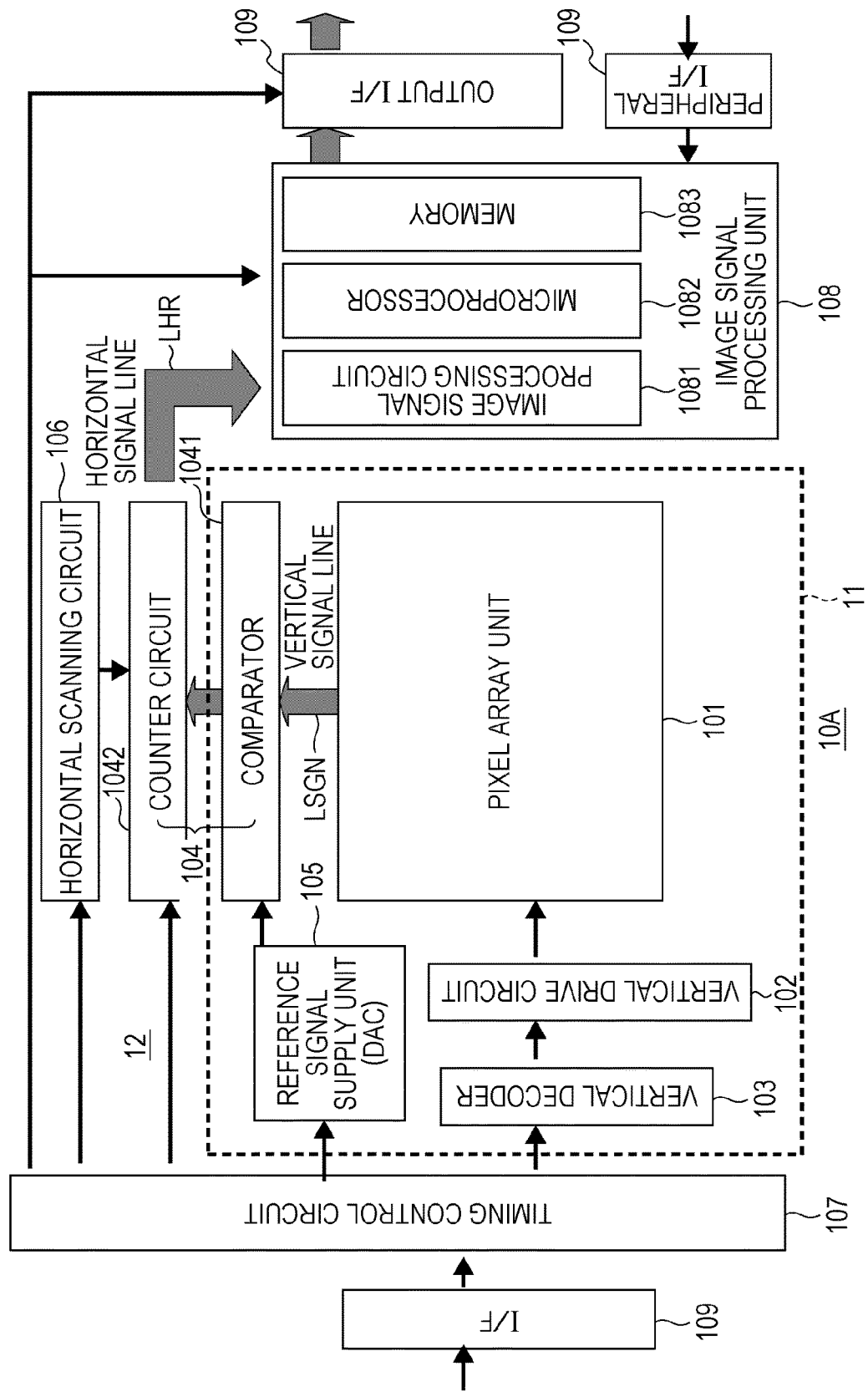
FIG. 4 is a block diagram illustrating a first exemplary configuration of the solid-state image sensor according to the embodiment.

FIG. 4 is a block diagram illustrating a first exemplary configuration of the solid-state image sensor according to the embodiment.

The solid-state image sensor 10A of FIG. 4 has a pixel array unit 101 on which a number of unit pixels (not illustrated) containing photoelectric conversion elements are arranged two-dimensionally in a matrix.

The solid-state image sensor 10A includes a vertical drive circuit (row scanning circuit) 102, a vertical decoder 103, a column processing unit 104, a reference signal supply unit 105, a horizontal scanning circuit (column scanning circuit) 106, a timing control circuit 107, and an image signal processing unit 108.

The solid-state image sensor 10A further includes I/F circuits 109.

The column processing unit 104 includes a comparator 1041 and a counter circuit 1042.

In the solid-state image sensor 10A, the timing control circuit 107 generates clock signals, control signals and the like that are references for operation of the vertical drive circuit 102, the column processing unit 104, the reference signal supply unit 105 and the horizontal scanning circuit 106 on the basis of a master clock.

In addition, peripheral drive circuits that drive and control the unit pixels of the pixel array unit 101 and analog circuits, which are the vertical drive circuit 102, the comparator 1041 of the column processing unit 104, and the reference signal supply unit 105 are integrated on the same first chip 11 as the pixel array unit 101.

On the other hand, the timing control circuit 107, the image signal processing unit 108, the counter circuit 1042 of the column processing unit 104 and the horizontal scanning circuit 106 are integrated on the second chip (semiconductor substrate) 12 different from the chip described above.

In FIG. 4, a part surrounded by a broken line is arranged on the first chip (upper chip) 11, and the other part is arranged on the second chip (lower chip) 12.

The unit pixels, which are not illustrated, each have a photoelectric conversion element (such as a photodiode). The unit pixels each have a transfer transistor that transfers an electrical charge resulting from photoelectric conversion at the photoelectric conversion element to a floating diffusion (FD) unit, for example, in addition to the photoelectric conversion element.

A three-transistor configuration may be applied to the unit pixels, where the unit pixels each have a reset transistor that controls the potential of the FD unit and an amplification transistor that outputs a signal based on the potential of the FD unit in addition to the transfer transistor. Alternatively, a four-transistor configuration or the like may be applied to the unit pixels, where the unit pixels each further have a selection transistor for selecting pixels in addition.

The unit pixels are two-dimensionally arranged on the pixel array unit 101 in m rows and n columns, a row control line is provided for each row and a column signal line is provided for each column of the pixel arrangement of m rows and n columns.

One end of each row control line is connected to an output end associated with each row of the vertical drive circuit 102. The vertical drive circuit 102 includes a shift register or the like, and controls row addresses and row scanning of the pixel array unit 101 through the row control lines.

The column processing unit 104 includes analog-to-digital converters (ADCs) each provided to each pixel column of the pixel array unit 101, that is, each vertical signal line LSGN, for example, and converts analog signals output from the unit pixels of each column of the pixel array unit 101 into digital signals and outputs the digital signals.

The reference signal supply unit 105 includes a digital-to-analog converter (DAC), for example, as means for generating a reference voltage Vref having a so-called ramp waveform in which the level changes linearly with time.

Note that the means for generating a reference voltage Vref having a ramp waveform is not limited to the DAC.

The DAC generates a reference voltage Vref having a ramp waveform on the basis of a clock provided from the timing control circuit 107 and supplies the reference voltage Vref to the ADCs of the column processing unit 104 under the control by a control signal provided from the timing control unit 107.

Each of the ADCs can select A-D converting operation corresponding to each of a normal frame rate mode and a high-speed frame rate mode in progressive scan where information of all the unit pixels is read out.

The high-speed frame rate mode is an operation mode in which the exposure time of the unit pixels is set to 1/N to increase the frame rate by N times, such as twice, as compared to the normal frame rate mode.

The switching between the operation modes is performed by control by a control signal provided from the timing control circuit 107. The timing control circuit 107 is provided with instruction information for switching between the normal frame rate mode and the high-speed frame rate mode by an external system controller (not illustrated).

The ADCs all have the same configuration including the comparator 1041 and the counter circuit 1042. For example, the ADCs each include an up/down counter, a transfer switch and a memory.

The comparator 1041 compares a signal voltage of a vertical signal line associated with a signal output from the unit pixels on an n-th column of the pixel array unit 101 with the reference voltage Vref having a ramp waveform supplied from the reference signal supply unit 105.

An output Vco from the comparator 1041 is of an "H" level when the reference voltage Vref is higher than the signal voltage and of an "L" level when the reference voltage Vref is equal to or lower than the signal voltage Vx, for example.

The counter circuit 1042 that is an up/down counter is an asynchronous counter, and is provided with the clock from the timing control circuit 107 at the same time as the DAC under the control by the control signal provided from the timing control circuit 107.

The counter circuit 1042 counts down or counts up in synchronization with the clock to measure a comparison period from the start to the end of comparison operation at the comparator.

As described above, analog signals supplied from each column of the unit pixels of the pixel array unit 101 via the column signal line are converted into N-bit digital signals and stored into the memory by the operations of the comparator 1041 and the up/down counter circuit 1042.

The horizontal scanning circuit 106 includes a shift register or the like, and controls column addresses and column scanning of the ADCs in the column processing unit 104.

Under the control by the horizontal scanning circuit 106, the N-bit digital signals resulting from the A-D conversion by the respective ADCs are sequentially read into a horizontal signal line LHR, and output as imaging data via the horizontal signal line LHR to the image signal processing unit 108.

The image signal processing unit 108 is a circuit that performs various signal processing on the imaging data, and includes an image signal processor (ISP) 1081, a microprocessor 1082, a memory circuit 1083 and the like.

In the embodiment, the comparator 1041 mounted on the first chip (upper chip) 11 compares the signal voltage of a vertical signal line LSGN associated with a signal output from the unit pixels with the reference voltage Vref having a ramp waveform supplied from the reference signal supply unit 105.

Then, the comparison period of the comparison result from the start to the end of the comparison operation is counted by the counter circuit 1042 mounted on the second chip (lower chip) 12.

One feature of the embodiment is that the TCVs are inserted between the comparator 1041 and the counter circuit 1042 mounted on the upper and lower chips, respectively, and a video signal path through which signal transfer is performed is separated at this part.

The comparator 1041 mounted on the first chip (upper chip) 11 includes only high-voltage transistors (HV Tr.).

The comparator 1041 is mounted on the same chip (upper chip) 11 as the pixel array unit 101 and the reference signal supply unit 105, and the process thereof is controlled such that sufficient analog characteristics and noise characteristics (in particular, 1/f noise) can be obtained.

The counter circuit 1042 mounted on the second chip (lower chip) 12 includes only low-voltage transistors (LV Tr.), and is designed for high-speed operation by using the advanced Logic process.

The TCVs are susceptible to crosstalk noise from adjacent signals because of the structure thereof, and CMOS digital signals that are as resistant to noise as possible are preferably used particularly when the TCVs are coupled to video signals from an ADC unit with narrow wiring pitch.

The output from the comparator 1041 is a so-called CMOS logic signal having data along the time axis, and the output Vco is of an "H" level when the reference voltage Vref is higher than the signal voltage and of an "L" level when the reference voltage Vref is equal to or lower than the signal voltage Vx, for example.

The CMOS logic signal has relatively high resistance to noise.

<4. TCV Layout>

The TCVs are used mainly for connection of image signals from the ADCs of the column processing unit 104, control signals from circuits other than the pixel array unit 101 mounted on the first chip (upper chip) 11, and the power supply/GND of the first chip (upper chip) 11 between the upper and lower chips.

Figure 5:
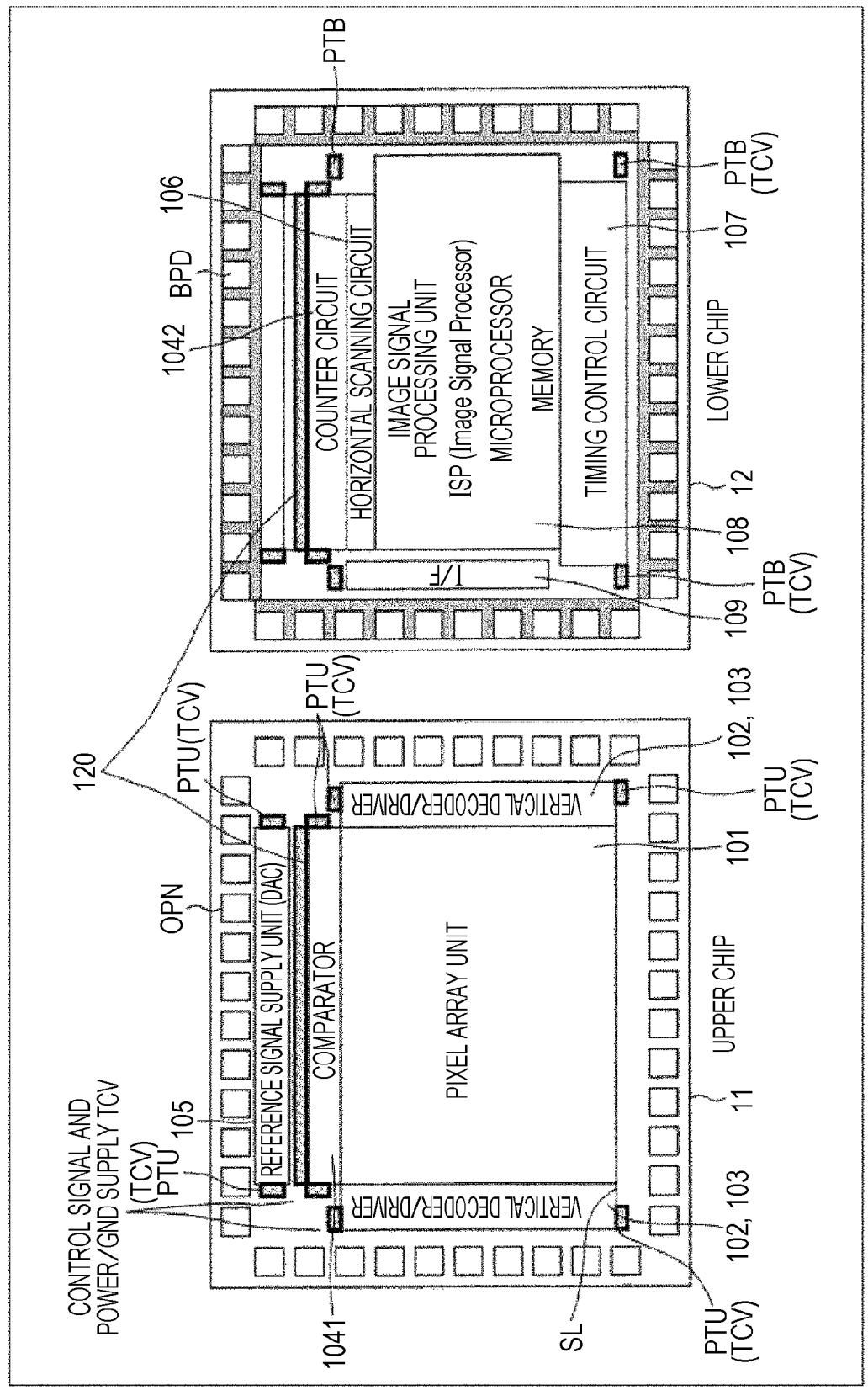
FIG. 5 is a diagram illustrating an example of floorplans of a first chip and a second chip according to the embodiment.

FIG. 5 is a diagram illustrating an example of floorplans of the first chip and the second chip according to the embodiment.

In the example of FIG. 5, a circuit block of the vertical drive circuit 102, the vertical decoder 103, the reference signal generating unit 105 and the comparator 1041 mounted on the first chip (upper chip) 11 is laid out to have ports PTU for power supply and signals on shorter sides thereof.

The TCVs for supplying control signals and power are arranged near the shorter sides of the circuit block described above to prevent signal wiring LSG and power wiring LPWR from becoming long on the first chip (upper chip) 11, which prevents an increase in the chip area of the first chip (upper chip) 11.

The column processing unit and TCVs for pixel signals 120 constitute a circuit block of TCVs arranged into a line with a pitch equal to that of the vertical signal lines LSGN or into an array with a pitch larger than that of the vertical signal lines LSGN to connect wideband video signals between the first chip and the second chip. The block is arranged adjacent to a longer edge of the circuit block of the comparator 1041 on the first chip (upper chip) and to that of the circuit block of the counter 1042 on the second chip (lower chip).

Figure 6:
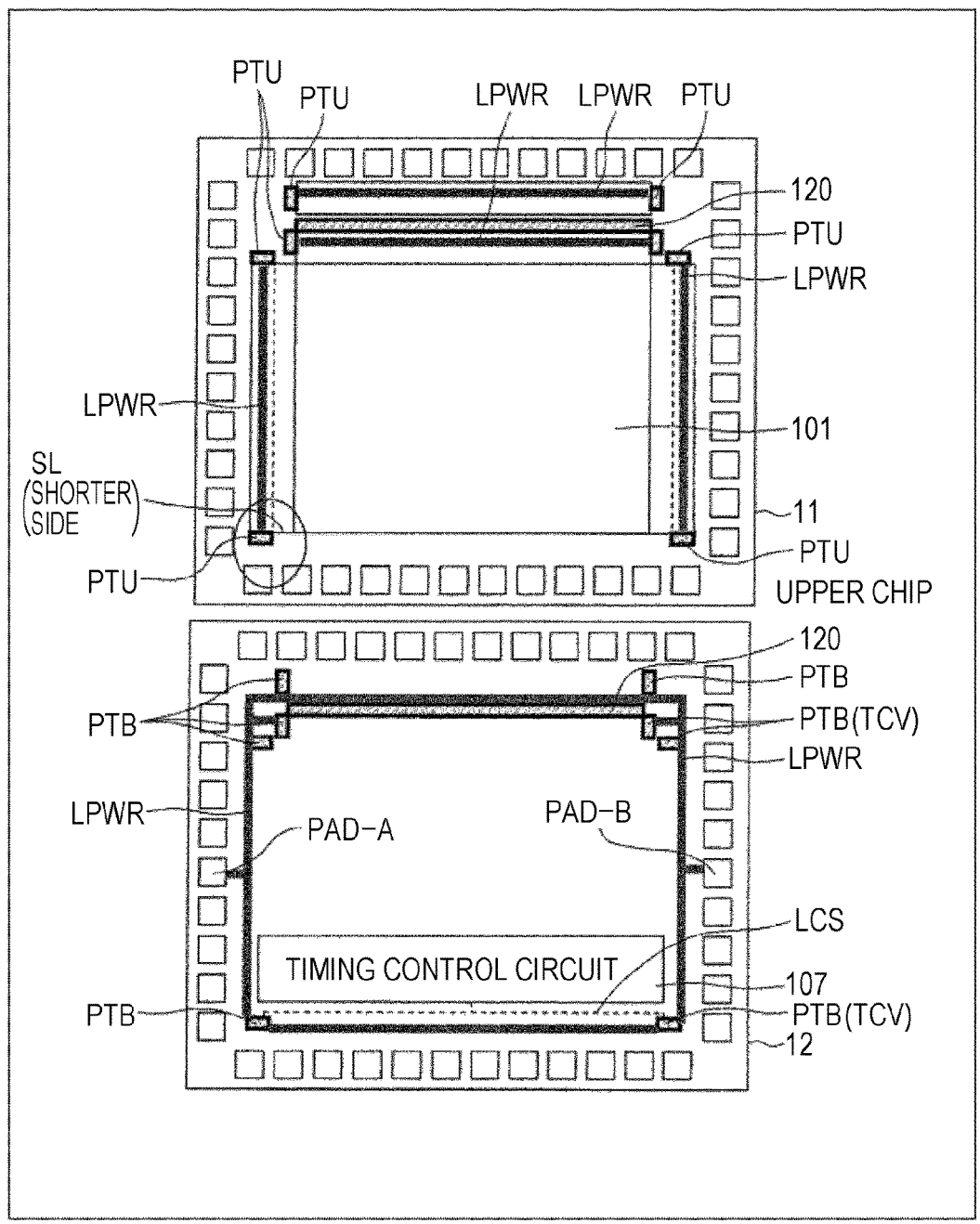
FIG. 6 is a diagram illustrating an exemplary layout of power supply wiring in the floorplans of the first chip and the second chip according to the embodiment.

FIG. 6 is a diagram illustrating an exemplary layout of the power supply wiring in the floorplans of the first chip and the second chip according to the embodiment.

Taking the power wiring LPWR as an example, it is assumed that power is supplied from PAD-A and PAD-B of the second chip (lower chip) 12 illustrated in FIG. 6.

Note that, in the second chip (lower chip) 12, PAD-A and PAD-B are connected to TCVs near the circuit block on the first chip (upper chip) 11 to which power is to be supplied with a sufficiently low impedance.

On the first chip (upper chip) 11, the power supply wiring LPWR for power supplied through the TCVs is directly connected to the ports PTU of the circuit blocks.

Similarly, in the case of signal wiring LCS for control signals, the signal wiring LCS for control signals output from the timing control circuit 107 of the second chip (lower chip) 12 is connected to TCVs near shorter edges of the circuit block on the first chip (upper chip) 11 to which the wiring is to be connected.

Thus, the signals are input to the ports PTU of the circuit block on the first chip (upper chip) 11 via the TCVs.

The circuit block on the first chip (upper chip) 11 includes the vertical drive circuit 102 and the vertical decoder 103 in the example of FIG. 6.

Figure 7:
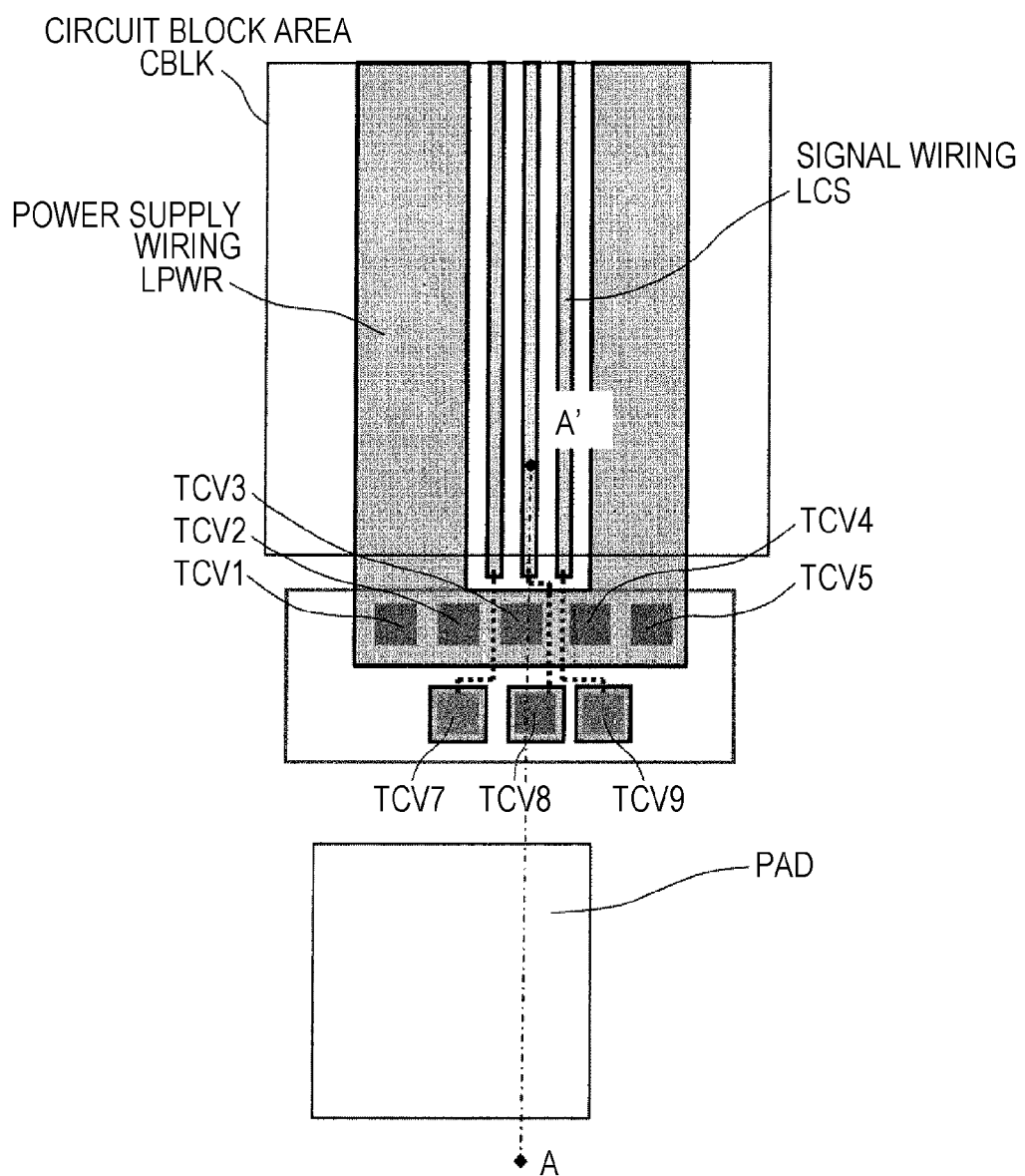
FIG. 7 is an enlarged view of a part circled by a circle A in FIG. 6 and illustrates a specific example of TCVs arranged near a circuit block.

FIG. 7 is an enlarged view of a part circled by a circle A in FIG. 6 and illustrates a specific example of TCVs arranged near a circuit block (the vertical decoder in this example).

Figure 8:
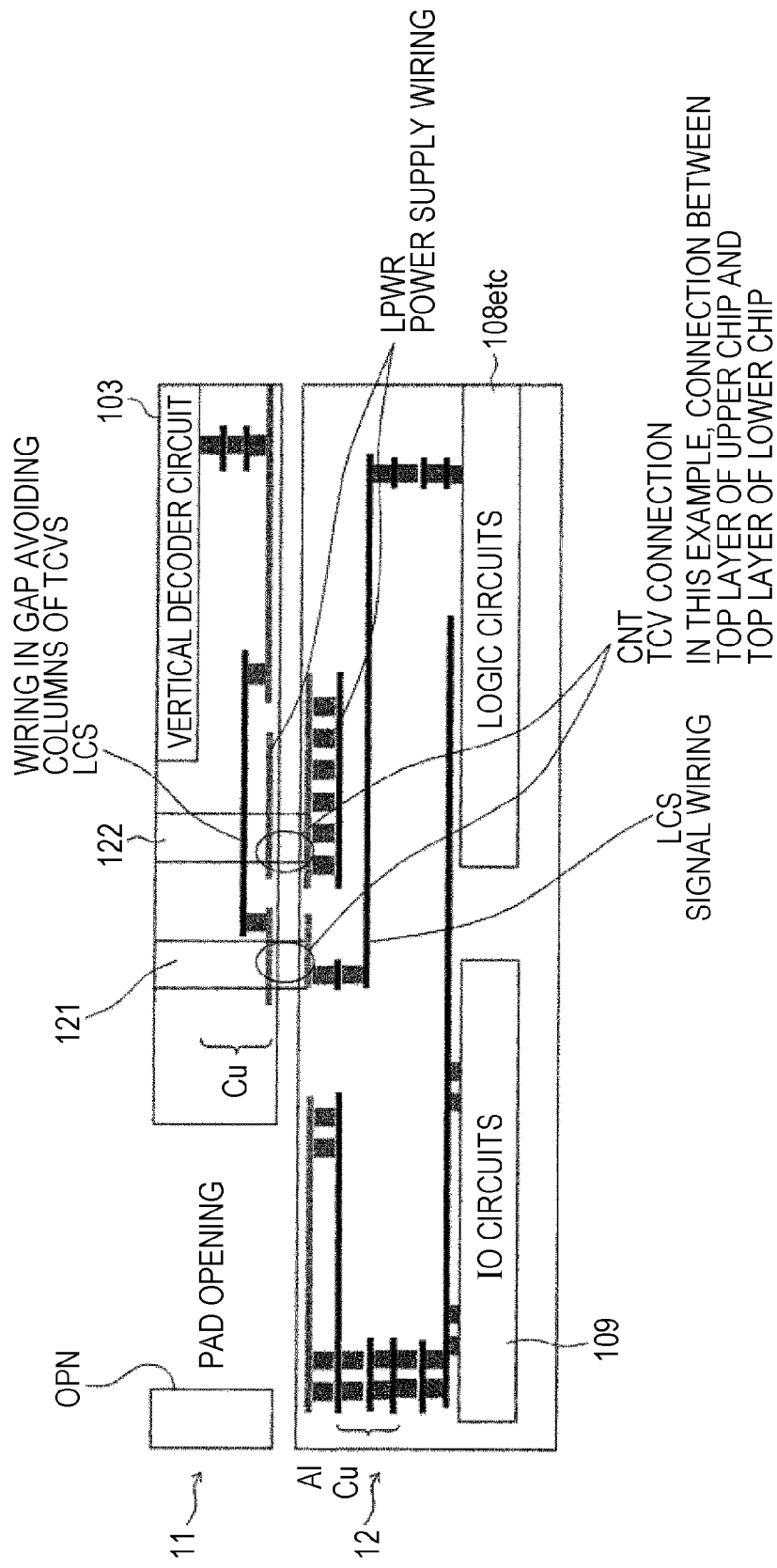
FIG. 8 is a diagram illustrating a cross-section structure taken along line A-A' in FIG. 7.

FIG. 8 is a diagram illustrating a cross-section structure taken along line A-A' in FIG. 7.

In FIG. 7, only components related to wiring on the first chip (upper chip) 11 are illustrated.

In FIG. 7, TCV 1 to TCV 5 are TCVs for power supply and connect the power supply wiring LPWR for power supplied from the second chip (lower chip) 12 to the circuit block CBLK on the first chip (upper chip) 11.

In FIG. 7, TCV 7 to TCV 9 are TCVs for supplying control signals and connect the signal wiring LCS for control signals between the upper and lower chips.

On the first chip (upper chip) 11, spaces between TCVs for power supply are used for wiring of a wiring layer (not illustrated) different from the wiring layer for TCV connections and connected to the circuit block CBLK.

In this example, the signal wiring LCS is provided in gaps between columns of TCVs 121 and 122 avoiding the columns.

In addition, on the first chip (upper chip) 11, TCV 1 to TCV 5 for power supply are arranged inside of TCV 7 to TCV 9 for supplying control signals with respect to the edge of the chip.

As a result, it is possible to increase the area of the power supply wiring LPWR as illustrated in FIG. 7 and reduction in resistance becomes easier to achieve.

The wirings are formed of Al and Cu.

In the example of FIG. 8, a case where the uppermost layer of the first chip (upper chip) 11 and the uppermost layer of the second chip (lower chip) 12 are connected by TCV connections CNT is illustrated as an example.

Note that FIG. 8 merely illustrates one example of TCV connections, and the use of wiring layers and the positions of circuits on each of the upper and lower chips are arbitrary and thus not limited thereto.

In the embodiment, since the number of wiring layers on the first chip (upper chip) 11 is minimized, the impedance of the power supply wiring LPWR in the circuit block on the first chip (upper chip) 11 may be increased, which may lead to malfunction of the circuit block.

If the power supply wiring is simply made thicker, the chip size will be increased. Thus, it is also possible to enhance the power supply of the power supply wiring LPWR on the first chip (upper chip) 11 using the wirings of the second chip (lower chip) 12 as measures against noise and for stable supply.

Figure 9:
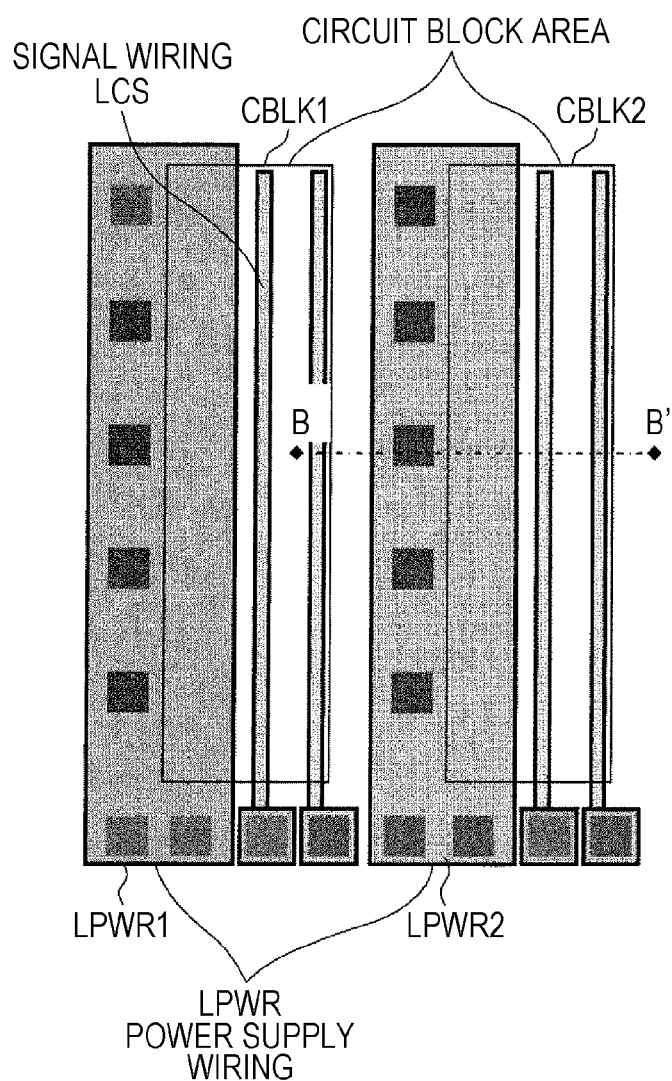
FIG. 9 is a diagram illustrating a modified example of circuit block wiring of FIG. 8.

FIG. 9 is a diagram illustrating a modified example of the circuit block wiring of FIG. 8.

Figure 10:
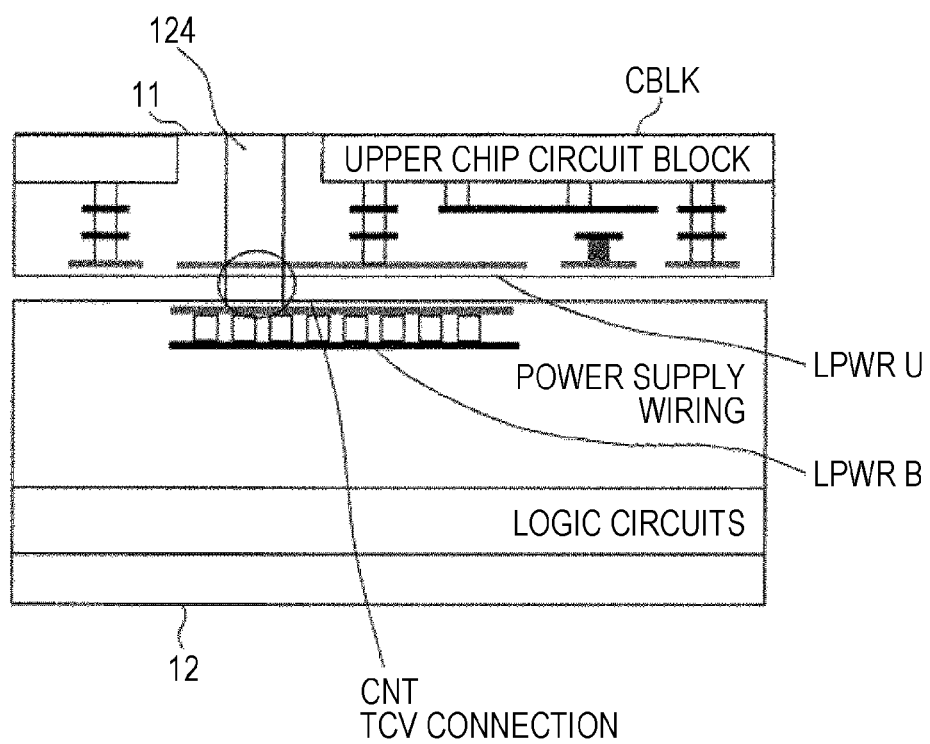
FIG. 10 is a diagram illustrating a cross-section structure taken along line B-B' in FIG. 9.

FIG. 10 is a diagram illustrating a cross-section structure taken along line B-B' in FIG. 9.

In FIG. 10, wiring necessary for connections in logic circuits on the second chip (lower chip) 12 is not illustrated for simplification.

In this modified example, the circuit block is divided into two circuit blocks CBLK1 and CBLK2, and TCVs are arranged in spaces therein.

Then, the second chip (lower chip) 12 is backed with power supply line LPWRB provided in parallel with power supply wiring LPWRU on the first chip (upper chip) 11.

In the embodiment, connection between the upper and lower chips is achieved through TCVs, and since the arrangement pitch is sufficiently small owing to the structure thereof and the TCVs are processed during wafer processes, the yield is less likely to be lowered.

Moreover, since DC components of power supply and reference signals from the second chip (lower chip) 12 to the first chip (upper chip) 11 are supplied via the TCVs, special circuits for communication are not necessary, and the cost can be reduced as a result.

As described above, the following effects can be produced according to the embodiment.

As a result of the configuration in which signals at edge parts where image data signals are communicated are signals output from the comparator, for example, the problem of noise at TCV connections can be reduced and a circuit configuration most suitable for the circuit layout between the upper and lower chips can be achieved.

As a result of focusing on analog characteristics and noise characteristics (in particular, 1/f noise) and arranging circuits with characteristics affected by noise on the upper chip (first chip), the upper chip can achieve characteristics excellent in resistance to noise.

As a result of focusing on analog characteristics and noise characteristics (in particular, 1/f noise) and arranging circuits with characteristics affected by noise on the upper chip (second chip), the lower chip can use a general ASIC (Logic) process. Moreover, a change in the wafer FAB and development to other FABs of the lower chip are easily possible.

The attempt to reduce the cost by using a minimum number of wiring layers on the upper chip and the problem of IR-drop or the like in the upper chip involved therein can be solved by reinforcing the lower chip by wiring through TCVs.

As a result of producing the pixel part and the logic part of the image sensor separately by optimum processes, and bonding the parts at the wafer level to obtain a stacked chip, the effect of reducing the chip cost can be produced.

The optimum processes are a circuit including a minimum necessary number of wiring layers constituted only by high-voltage transistors (HV Tr.) for the upper chip and a general ASIC process for the lower chip.

Various product developments are possible by using the same upper chip and changing the lower chip.

Note that the vertical decoder 103 that is a digital circuit is arranged on the first chip 11 in the configuration of FIG. 4 in the embodiment. It is also possible, however, to employ other configurations.

Figure 11:
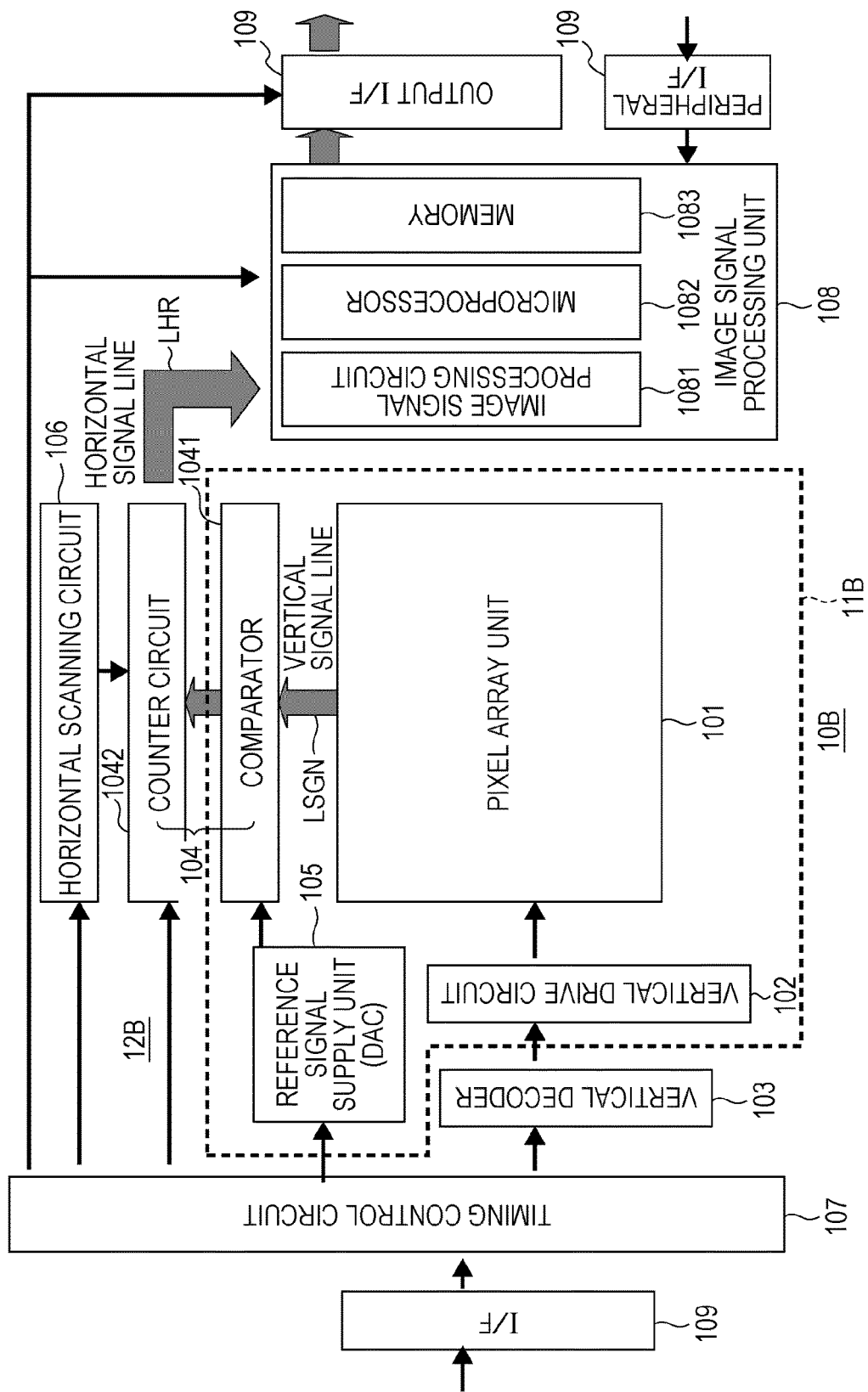
FIG. 11 is a block diagram illustrating a second exemplary configuration of the solid-state image sensor according to the embodiment.

FIG. 11 is a block diagram illustrating a second exemplary configuration of the solid-state image sensor according to the embodiment.

The solid-state image sensor 10B according to the embodiment of the present invention may be configured such that the vertical decoder 103 is mounted on a second chip 12B, and analog circuits and digital circuits are mounted on different chips as illustrated in FIG. 11.

Figure 12:
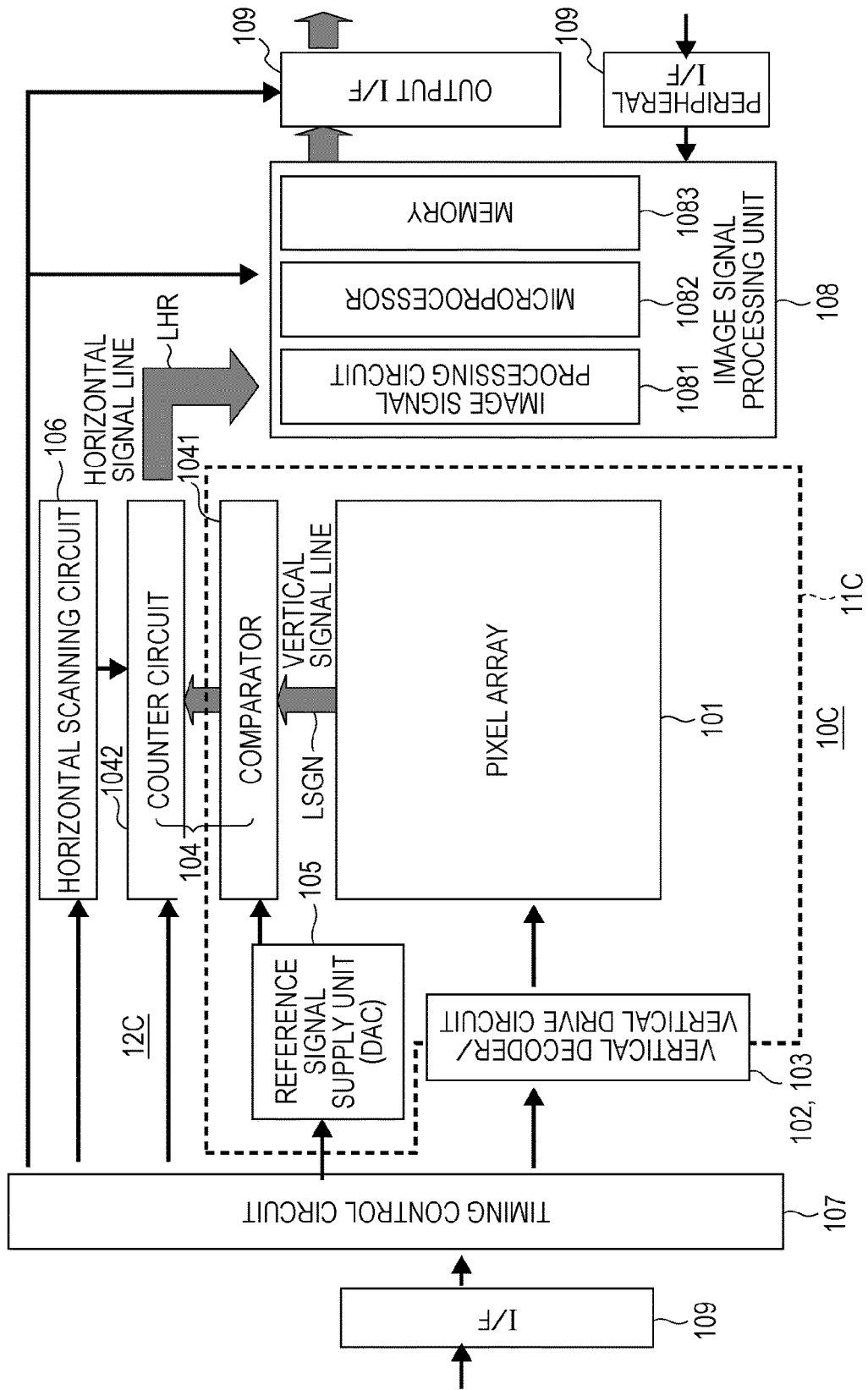
FIG. 12 is a block diagram illustrating a third exemplary configuration of the solid-state image sensor according to the embodiment.

FIG. 12 is a block diagram illustrating a third exemplary configuration of the solid-state image sensor according to the embodiment.

Figure 13:
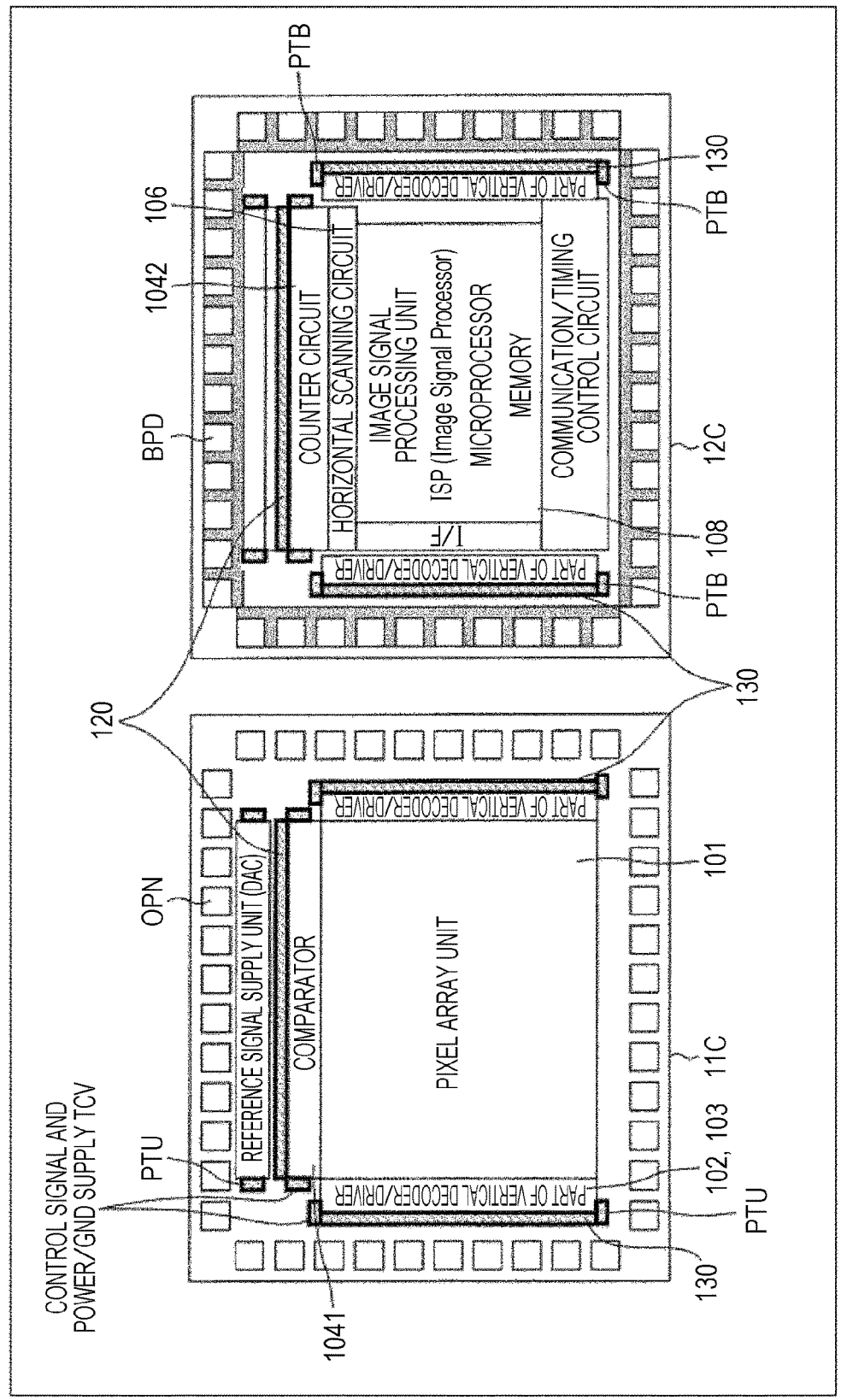
FIG. 13 is a diagram illustrating an example of floorplans of the first chip and the second chip in the solid-state image sensor of FIG. 12.

FIG. 13 is a diagram illustrating an example of floorplans of the first chip and the second chip in the solid-state image sensor of FIG. 12.

In the embodiment, if the size of circuits to be mounted on the second chip (lower chip) 12 are small, the solid-state image sensor can also be configured as illustrated in FIG. 12 so as to reduce the chip size thereof.

Specifically, as in the solid-state image sensor 10C in FIG. 12, part of the vertical drive circuit (row scanning circuit) 102 and the vertical decoder 103 among the circuits to be mounted on the first chip (upper chip) 11 can be moved onto the second chip (lower chip) 12.

In this case, the vertical drive circuit (row scanning circuit) 102 and the vertical decoder 103 may be separately mounted on the first chip (upper chip) 11 and the second chip (lower chip) 12, respectively.

Alternatively, the vertical drive circuit (row scanning circuit) 102 and the vertical decoder 103 may be integrated into one functional block and part thereof may be mounted on the first chip (upper chip) 11 and the rest thereof may be mounted on the second chip (lower chip) 12.

In the example of floorplans in FIG. 13, as a result of dividing a circuit block into which the vertical drive circuit (row scanning circuit) 102 and the vertical decoder 103 are integrated for the upper and lower chips, areas of TCVs for signals to electrically connect between the divided blocks are additionally provided.

Because the vertical drive circuit (row scanning circuit) 102 and the vertical decoder 103 are divided for the upper and lower chips, however, the layout width of the block on the upper chip is reduced and the chip size of the solid-state image sensor 10C is reduced.

Figure 14:
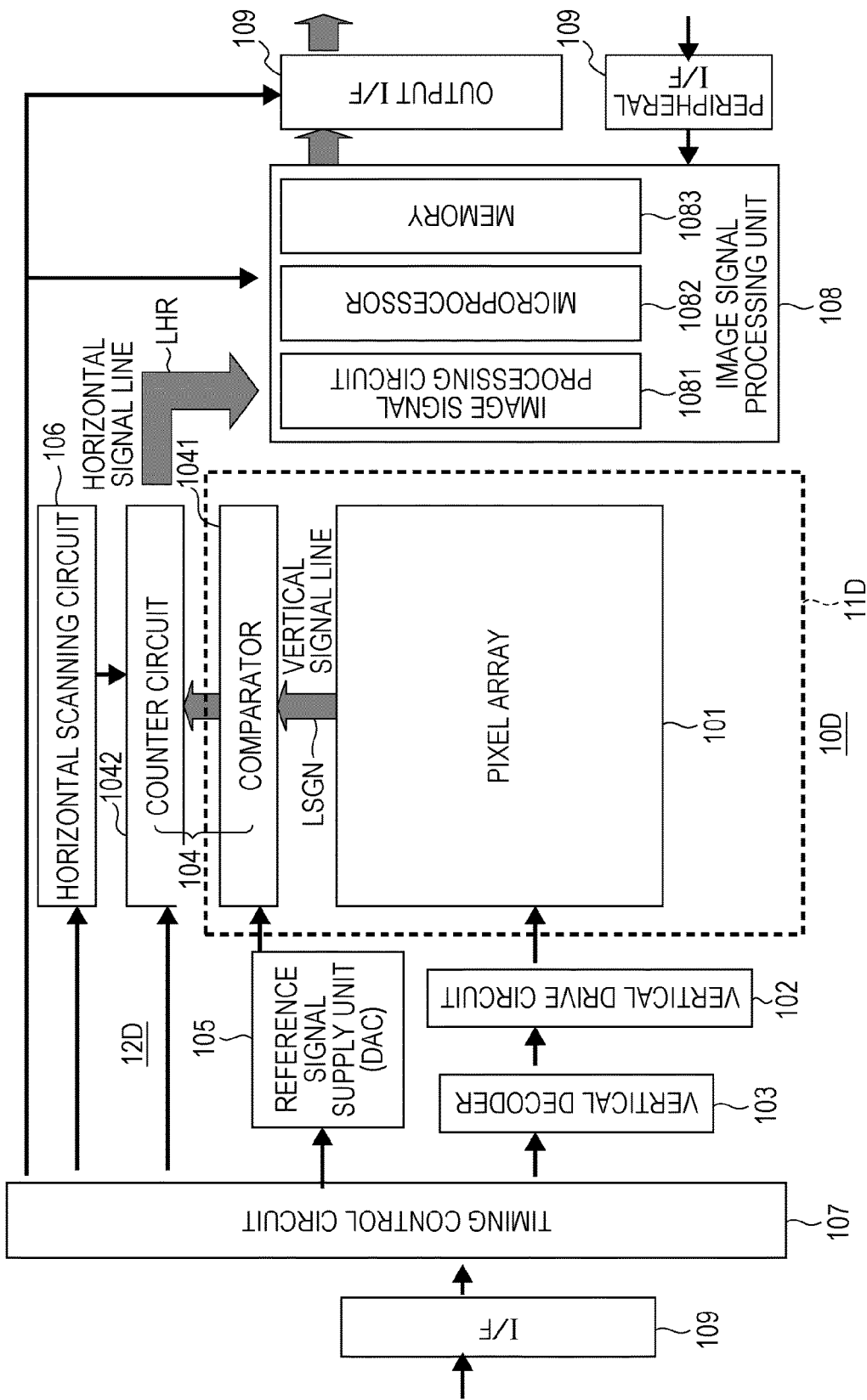
FIG. 14 is a block diagram illustrating a fourth exemplary configuration of the solid-state image sensor according to the embodiment.

FIG. 14 is a block diagram illustrating a fourth exemplary configuration of the solid-state image sensor according to the embodiment.

Figure 15:
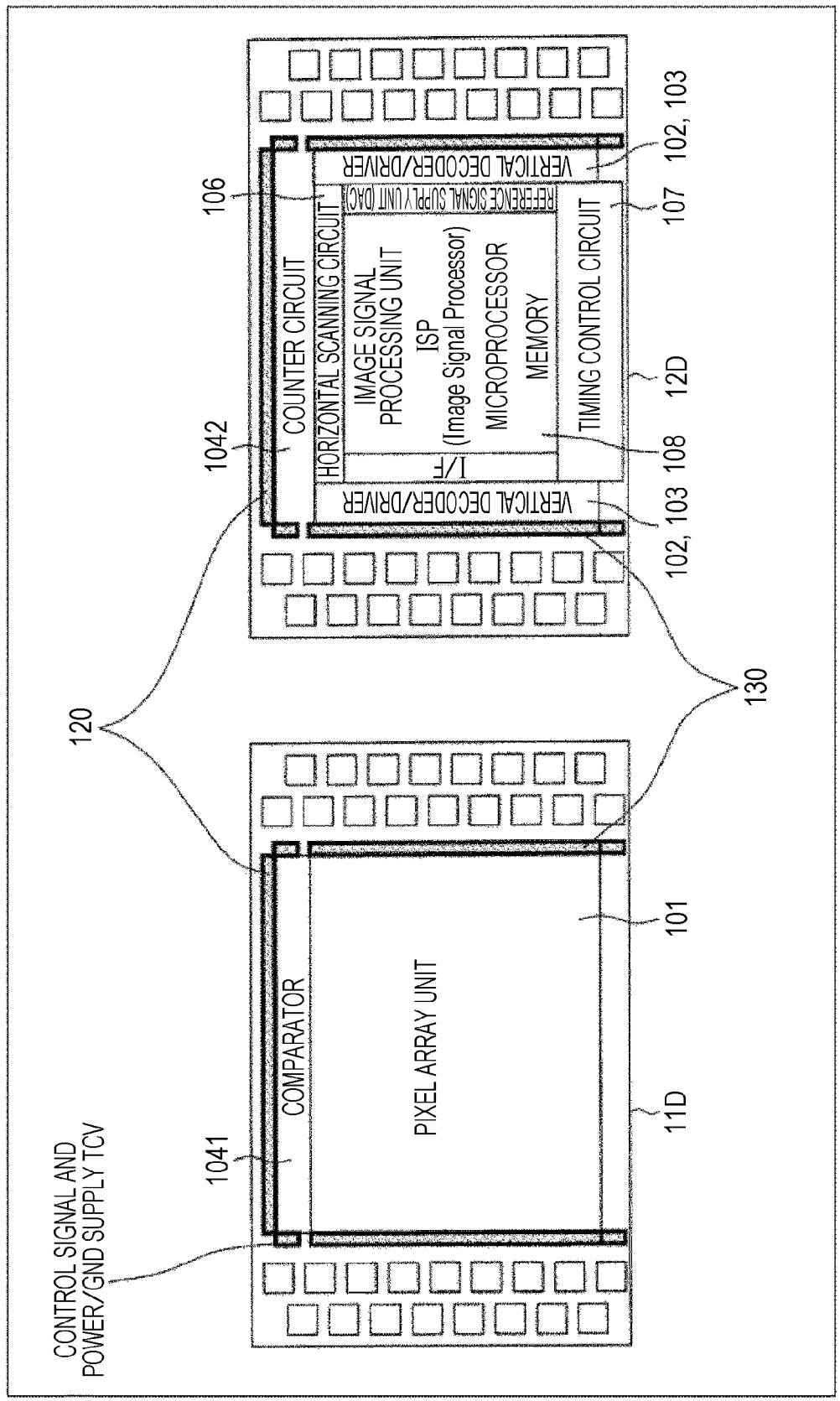
FIG. 15 is a diagram illustrating an example of floorplans of the first chip and the second chip in the solid-state image sensor of FIG. 14.

FIG. 15 is a diagram illustrating an example of floorplans of the first chip and the second chip in the solid-state image sensor of FIG. 14.

In the embodiment, if the size of circuits to be mounted on the second chip (lower chip) 12 is still smaller, the solid-state image sensor may be configured as illustrated in FIG. 14.

Specifically, as in the solid-state image sensor 10D in FIG. 14, the whole of the vertical drive circuit (row scanning circuit) 102 and the vertical decoder 103, and the reference signal supply unit 105 can be mounted on the second chip (lower chip) 12.

In this case, since analog circuits are included in the reference signal supply unit 105, the noise amount of the second chip (lower chip) 12 should be paid attention to.

Because the reference signal supply unit 105 is less likely to be affected by noise as compared to the comparator 1041, however, the reference signal supply unit 105 can be mounted on the second chip (lower chip) 12.

In the example of floorplans in FIG. 15, the circuit size of the image signal processing unit is smaller, but the vertical drive circuit (row scanning circuit) 102, the vertical decoder 103 and the reference signal supply unit 105 are mounted on the second chip (lower chip) 12.

As compared to the configuration example of FIG. 5, the first chip (upper chip) 11 does not include the whole of the vertical drive circuit (row scanning circuit) 102 and the vertical decoder 103, and the reference signal supply unit 105, and the chip size thereof is reduced.

Although not illustrated, part of the vertical drive circuit (row scanning circuit) 102 and the vertical decoder 103 may be mounted on the first chip (upper chip) 11.

Moreover, although PADs are arranged in two rows on two sides on the left and on the right in the example of FIG. 15, various arrangements such as arrangement on four sides, arrangement on three sides and arrangement in two rows on two sides are possible for PAD arrangement where reservation of PAD areas and mounting on a lens module are considered.

In addition, an example of column-parallel ADCs including the comparator 1041 and the counter circuit 1042 as the column processing unit 104 is described in the embodiment described above, configurations of the column processing unit having other ADC functions may be employed in the present invention.

An exemplary configuration of the column processing unit to which a ΣΔ modulator (ΣΔ ADC) is applied will be described as an example thereof.

First, a basic configuration of the ΣΔ ADC (AD) converter will be described.

Figure 16:
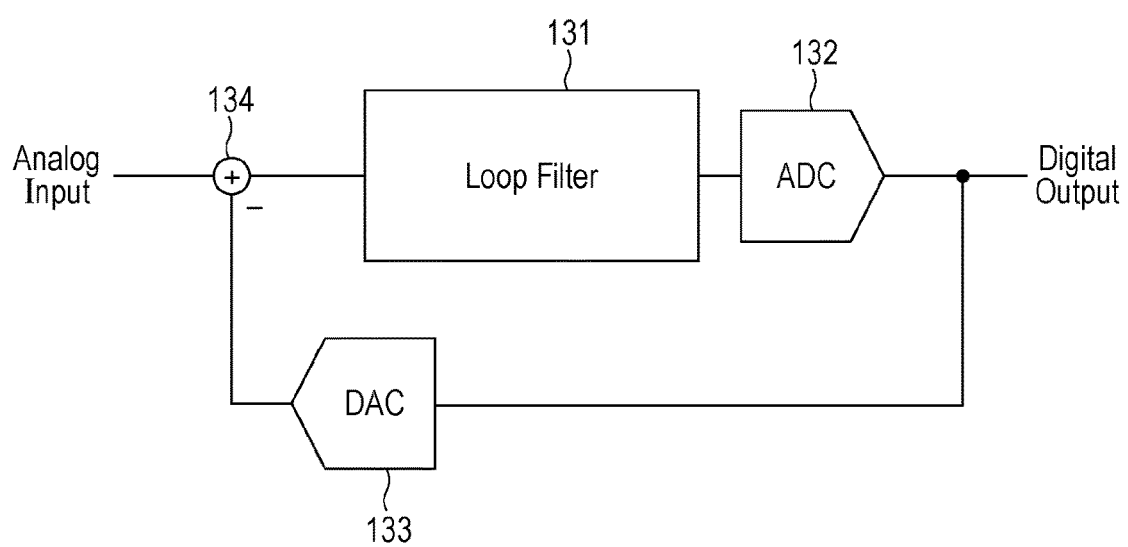
FIG. 16 is a block diagram illustrating a basic configuration of a $\Sigma\Delta$ AD converter.

FIG. 16 is a block diagram illustrating a basic configuration of the ΣΔ ADC (AD) converter.

The ΣΔ ADC 130 includes a filter part 131, an A-D converter (ADC) 132 with a low resolution of 1 to 5 bits, a D-A converter (DAC) 133 with the same number of bits as the ADC, and a subtractor 134 in an input stage.

Since the ΣΔ ADC 130 is a system using feedback, the nonlinearity of the circuit and the noise are reduced and a high resolution can be achieved.

Since it is more difficult for the ΣΔ ADC 130 to reduce the nonlinearity of the circuit and the noise for a part nearer to an analog input, it is desired that an input circuit of the filter part 131 and the DAC 133 have high linearity and low noise.

In particular, the nonlinearity of the DAC 133 causes an increase in the noise floor, and it is thus important to ensure the linearity of the DAC when an ADC with bits other than one bit is used.

Figure 17:
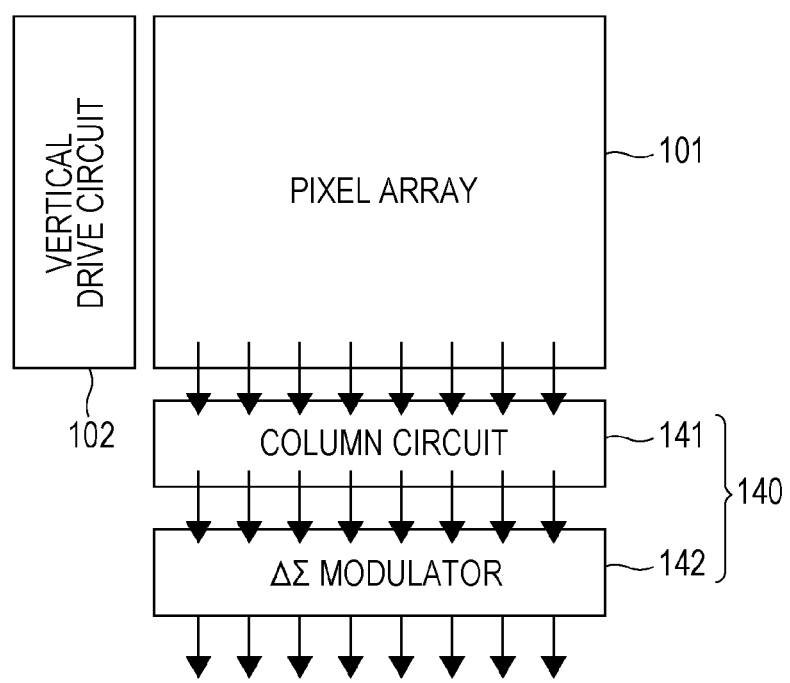
FIG. 17 is a diagram illustrating a basic configuration of a pixel array peripheral part of the solid-state image sensor when the $\Sigma\Delta$ AD converter is employed for a column processing unit.

FIG. 17 is a diagram illustrating a basic configuration of a pixel array peripheral part when the ΣΔ ADC is employed in the column processing unit of the solid-state image sensor.

The column processing unit 140 in FIG. 17 includes a column circuit 141 that performs processes such as CDS and a ΣΔ modulator (ΣΔ ADC) 142 that performs an ADC process.

When the ΣΔ modulator 142 is employed, an oversampling method mainly targeting at reduction of noise is employed.

Examples of techniques for oversampling include the following three methods.

Figure 18:
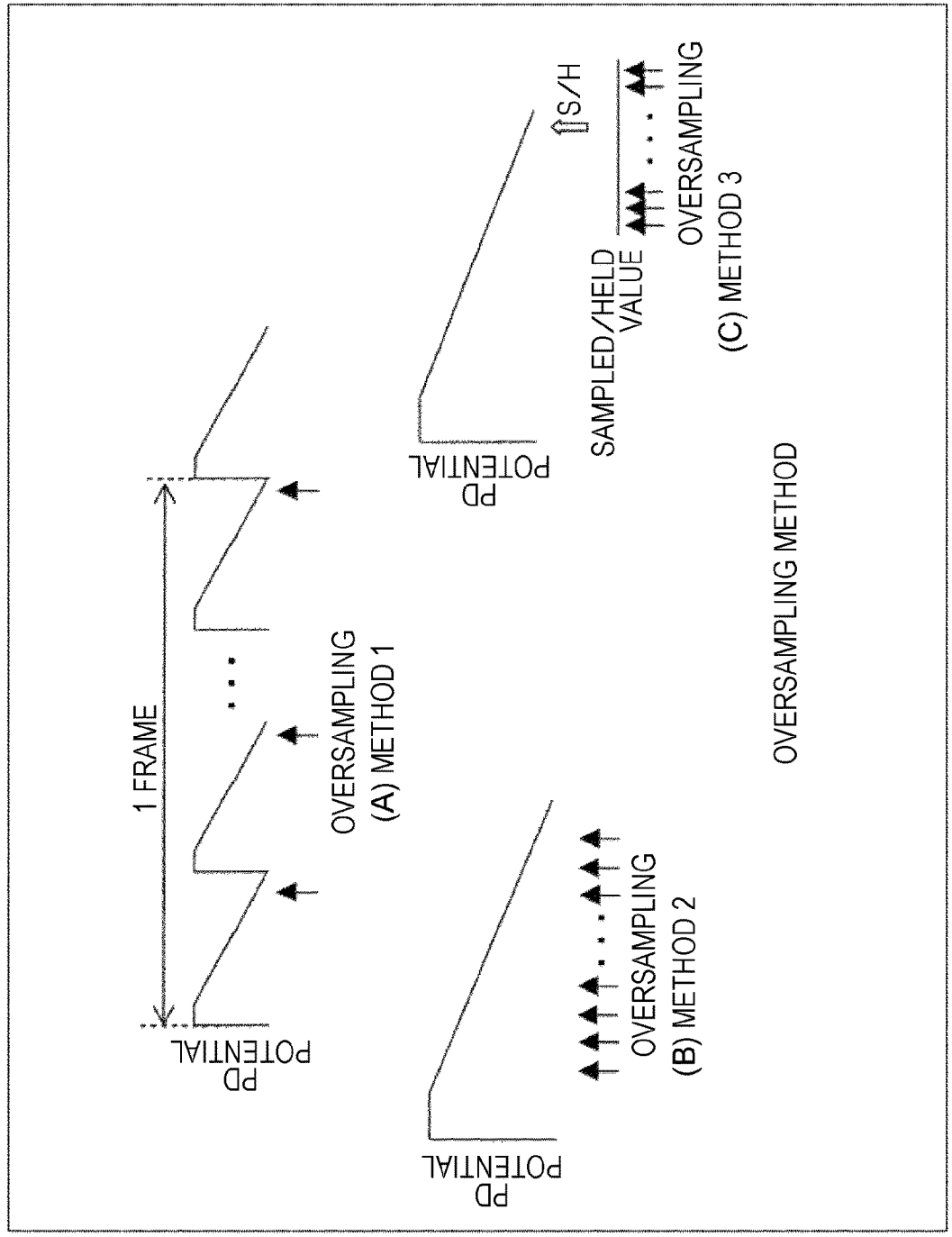
FIG. 18 is a diagram for explaining oversampling methods.

FIGS. 18(A) to 18(C) are diagrams for explaining the oversampling methods.

A first method is oversampling by performing readout at high speed during a video frame rate as illustrated in FIG. 18(A).

A second method is oversampling within a frame by non-destructive readout as illustrated in FIG. 18(B).

A third method is oversampling on a constant sampled value as illustrated in FIG. 18(C).

The third method, for example, is employed for the column processing unit 140 of FIG. 17.

A ΣΔ modulation output (ADC output) resulting from the oversampling is converted into a normal frame rate of N bits by a digital filter.

Figure 19:
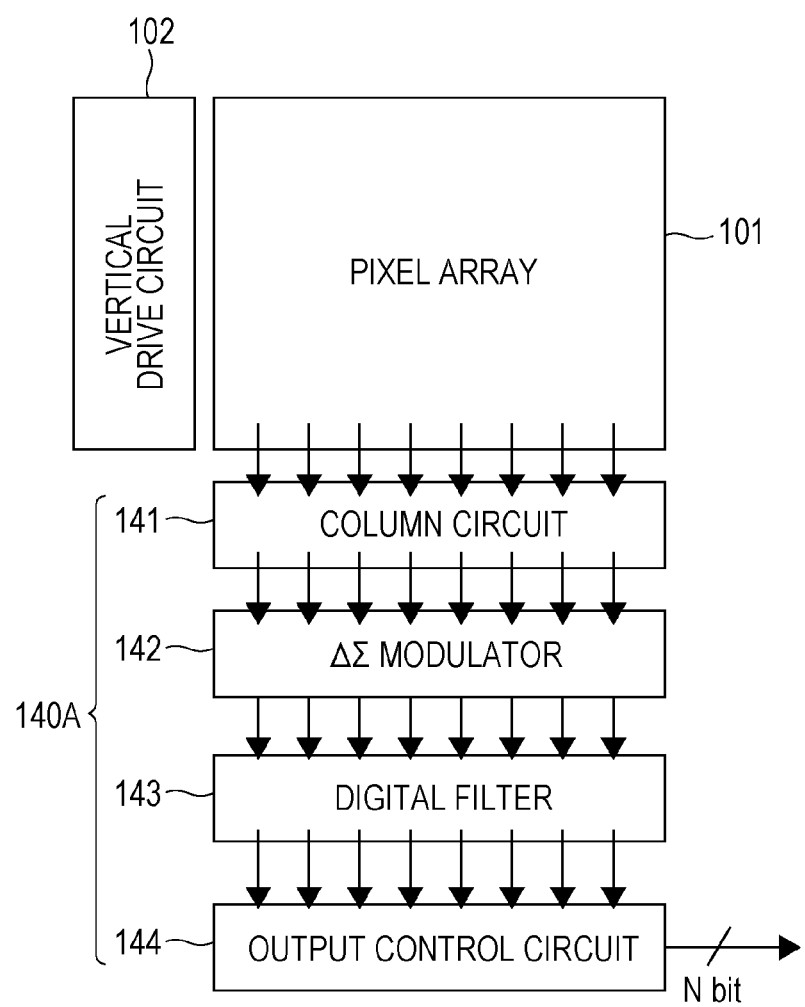
FIG. 19 is a diagram illustrating a first exemplary configuration of a pixel array peripheral part when a digital filter is employed for the column processing unit including a $\Sigma\Delta$ AD converter.

FIG. 19 is a diagram illustrating a first exemplary configuration of the pixel array peripheral part when a digital filter is employed for the column processing unit including a ΣΔ ADC.

Figure 20:
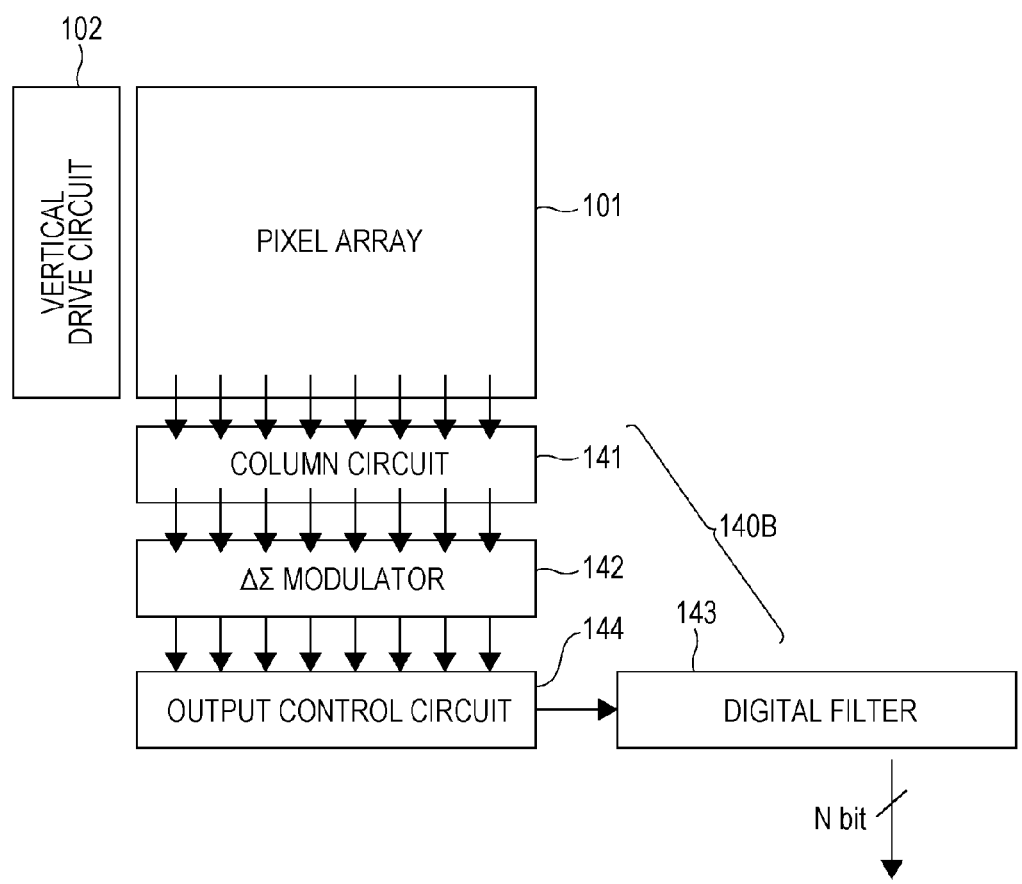
FIG. 20 is a diagram illustrating a second exemplary configuration of a pixel array peripheral part when a digital filter is employed for the column processing unit including a $\Sigma\Delta$ AD converter.

FIG. 20 is a diagram illustrating a second exemplary configuration of the pixel array peripheral part when a digital filter is employed for the column processing unit including a ΣΔ ADC.

The column processing unit 140A in FIG. 19 has a digital filter 143 arranged at the output of the ΣΔ modulator 142 and an output control circuit 144 arranged at the output of the digital filter 143.

The column processing unit 140B in FIG. 20 has the output control circuit 144 arranged at the output of the ΣΔ modulator 142 and the digital filter 143 arranged at the output of the output control circuit 144.

The digital filter 143 can be a programmable filter by being implemented by software.

Figure 21:
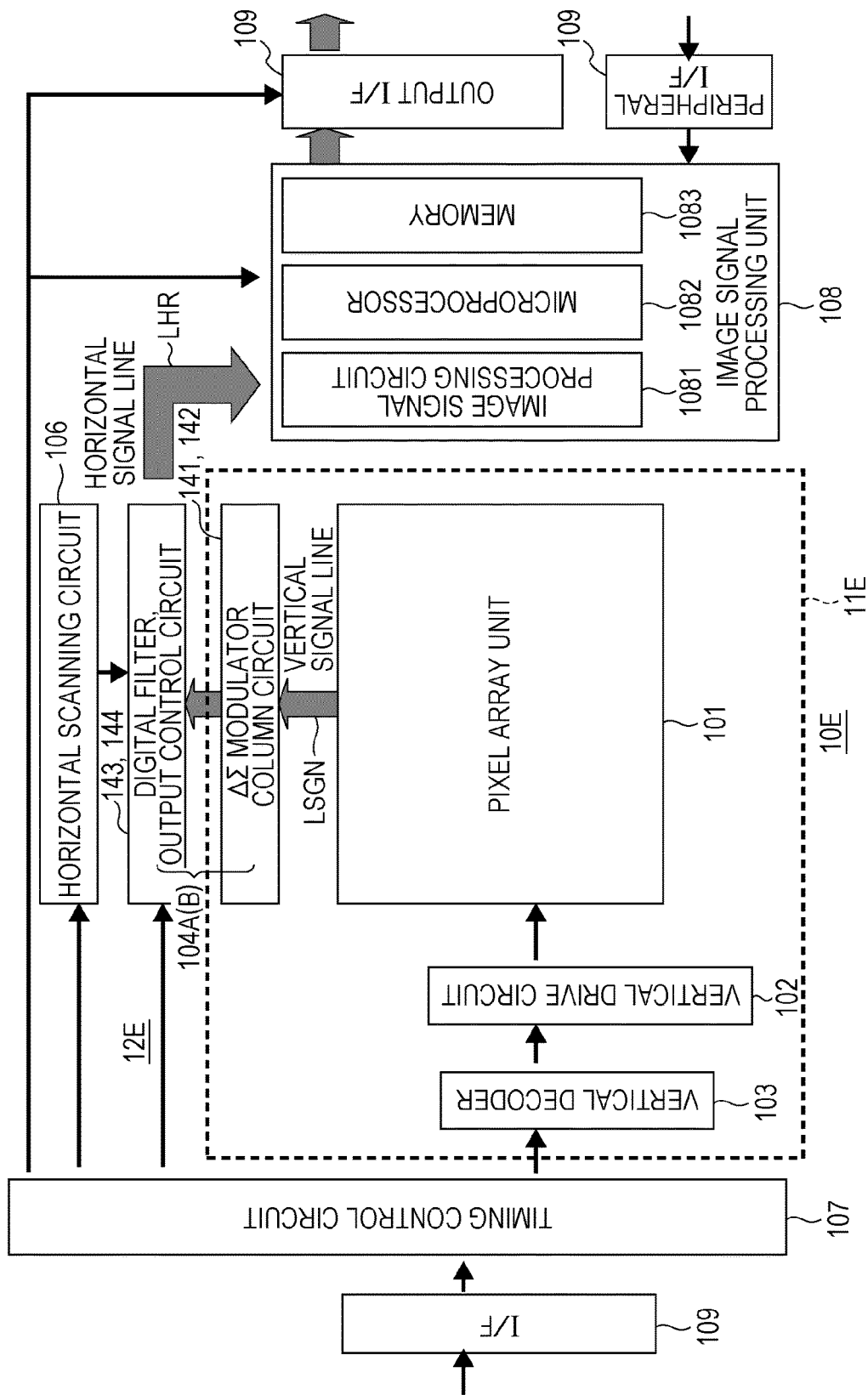
FIG. 21 is a block diagram illustrating a fifth exemplary configuration of the solid-state image sensor according to the embodiment.

FIG. 21 is a block diagram illustrating a fifth exemplary configuration of the solid-state image sensor according to the embodiment.

The solid-state image sensor 10E in FIG. 21 has an exemplary configuration in a case where the column processing units 140A and 140B in FIGS. 19 and 20 are employed.

In this configuration, an edge part where video data signals are communicated between the first chip 11 and the second chip 12 is an output part of the ΣΔ modulator that is a boundary circuit among analog circuits with digital circuits.

In other words, in the solid-state image sensor 10E, the column circuit 141 and the ΣΔ modulator (ΣΔ ADC) 142 that performs an ADC process are arranged on the first chip 11E. In addition, the digital filter 143 and the output control circuit 144 are arranged on the second chip 12E.

Although not illustrated, the configuration of FIG. 21 can similarly be employed in configurations similar to those of FIGS. 11, 12 and 14.

Effects similar to those described above can be produced according to such configurations.

Specifically, as a result of the configuration in which signals at edge parts where image data signals are communicated are signals output from the ΣΔ modulator, the problem of noise at TCV connections can be reduced and a circuit configuration most suitable for the circuit layout between the upper and lower chips can be achieved.

As a result of focusing on analog characteristics and noise characteristics (in particular, 1/f noise) and arranging circuits with characteristics affected by noise on the upper chip (first chip), the upper chip can achieve characteristics excellent in resistance to noise.

As a result of focusing on analog characteristics and noise characteristics (in particular, 1/f noise) and arranging circuits with characteristics affected by noise on the upper chip (second chip), the lower chip can use a general ASIC (Logic)

process. Moreover, a change in the wafer FAB and development to other FABs of the lower chip are easily possible.

The attempt to reduce the cost by using a minimum number of wiring layers on the upper chip and the problem of IR-drop or the like in the upper chip involved therein can be solved by reinforcing the lower chip by wiring through TCVs.

As a result of producing the pixel part and the logic part of the image sensor separately by optimum processes, and bonding the parts at the wafer level to obtain a stacked chip, the effect of reducing the chip cost can be produced.

The optimum processes are a circuit including a minimum necessary number of wiring layers constituted only by high-voltage transistors (HV Tr.) for the upper chip and a general ASIC process for the lower chip.

Various product developments are possible by using the same upper chip and changing the lower chip.

While the configuration of the CMOS image sensor is described as an example of the semiconductor device in this embodiment, the configuration can also be applied to a back side illuminated CMOS image sensor, for example, and the effects described above can also be produced in this case. A front side illuminated image sensor can also sufficiently produce the effects described above.

A solid-state image sensor having such a configuration can be applied as an imaging device for a digital camera and a video camera.

Figure 22:
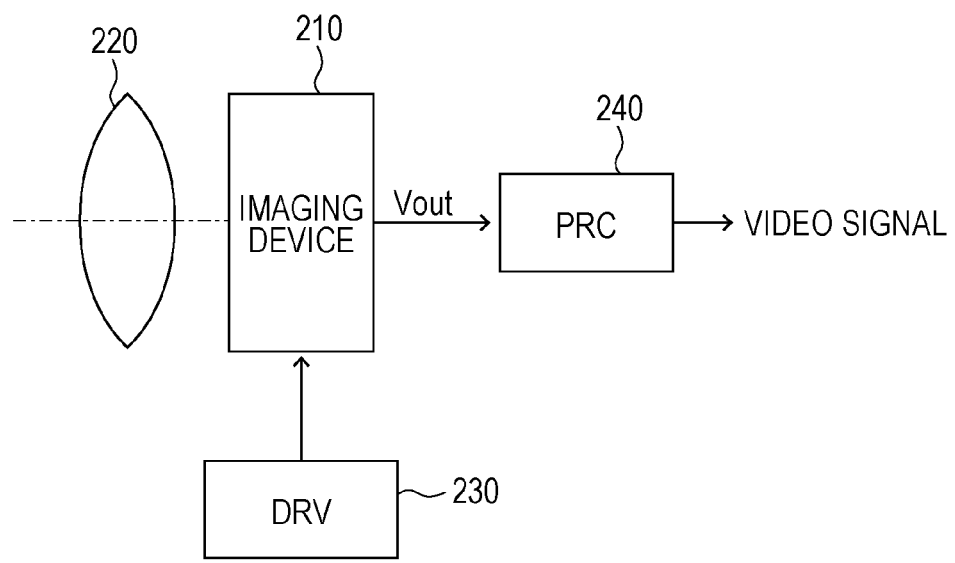
FIG. 22 is a diagram illustrating an example of a configuration of a camera system to which the solid-state image sensor according to an embodiment of the present invention is applied.

FIG. 22 is a diagram illustrating an example of a configuration of a camera system to which a solid-state image sensor according to an embodiment of the present invention is applied.

As illustrated in FIG. 22, the camera system 200 includes an imaging device 210 to which the CMOS image sensors (solid-state image sensors) 10, 10A to 10E according to the embodiment can be applied.

The camera system 200 further includes an optical system that guides input light to (form a subject image on) a pixel area of the imaging device 210, such as a lens 220 that focuses input light (image light) on an imaging plane.

The camera system 200 includes a drive circuit (DRV) 230 that drives the imaging device 210, and a signal processing circuit (PRC) 240 that processes signals output from the imaging device 210.

The drive circuit 230 has a timing generator (not illustrated) that generates various timing signals including a start pulse and a clock pulse for driving circuits in the imaging device 210, and drives the imaging device 210 with predetermined timing signals.

The signal processing circuit 240 performs predetermined signal processing on signals output from the imaging device 210.

Image signals processed by the signal processing circuit 240 are recorded on a recording medium such as a memory. The image information recorded on the recording medium is output in hard copy by a printer or the like. The image signals processed by the signal processing circuit 240 are displayed as moving images on a monitor such as a liquid crystal display.

As described above, a high-resolution camera can be realized by mounting the image sensors 10, 10A to 10E described above as the imaging device 210 in an image pick up apparatus such as a digital still camera.

REFERENCE SIGNS LIST 10, 10A to 10E . . . solid-state image sensor (semiconductor device), 11 . . . first chip (upper chip), 12 . . . second chip (lower chip), 101 . . . pixel array unit, 102 . . . vertical drive circuit (row scanning circuit), 103 . . . vertical decoder, 104 . . . column processing unit, 1041 . . . comparator, 1042 . . . counter circuit, 105 . . . reference signal supply unit, 106 . . . horizontal scanning circuit (column scanning circuit), 107 . . . timing control circuit, 108 . . . image signal processing unit, 109 . . . I/F circuits, LPWR . . . power supply wiring, LCS . . . signal wiring, 120, 121, 122, 1 to 9 . . . TCV, 130 . . . ΣΔ modulator (ΣΔ ADC), 140 . . . column processing unit, 141 . . . column circuit, 142 . . . ΣΔ modulator (ΣΔ ADC), 143 . . . digital filter, 144 . . . output control circuit, CBLK, CBLK1, CBLK2 . . . circuit block, 200 . . . camera system

What is claimed is:

1. An imaging device comprising:
   a first substrate including a pixel array unit, wherein a first side of the pixel array unit is disposed along a first direction and a second side of the pixel array unit is disposed along a second direction;
   a second substrate including a plurality of counters; and
   a first plurality of vias and a second plurality of vias electrically connecting the first and second substrates,
   wherein,
      the first plurality of vias is located outside of the pixel array unit and along the first direction,
      the second plurality of vias is located outside of the pixel array unit and along the second direction, and
      the second direction is perpendicular to the first direction.

2. The imaging device according to claim 1, wherein the second substrate further includes a reference signal generation circuit.

3. The imaging device according to claim 1, wherein the second substrate further includes a portion of a pixel driving circuit.

4. The imaging device according to claim 1, wherein the first and second plurality of vias are located at end portions of a circuit block mounted on the first substrate.

5. The imaging device according to claim 4, wherein the circuit block mounted on the first substrate includes at least a portion of at least one of a drive circuit, a decoder circuit, and a comparator.

6. The imaging device according to claim 1, wherein the first and second plurality of vias are located at corner portions of a circuit block mounted on the first substrate.

7. The imaging device according to claim 6, wherein the circuit block mounted on the first substrate includes at least a portion of at least one of a drive circuit, a decoder circuit, and a comparator.

8. The imaging device according to claim 1, wherein the first substrate further includes a comparator.

9. The imaging device of claim 1, wherein the first substrate includes:
   a via for supplying power;
   a via for signals;
   power supply wiring for power supplied through a via connected to a port of a circuit block on the first substrate; and
   signal wiring connected to a via near a corner of the circuit block.

10. The imaging device according to claim 1, wherein the first substrate includes an analog circuit, and wherein the second substrate includes a digital circuit.

* * * * *